(12) United States Patent
Takei et al.

(10) Patent No.: US 7,989,304 B2
(45) Date of Patent: Aug. 2, 2011

(54) METHOD FOR TRANSFERRING SEMICONDUCTOR ELEMENT, METHOD FOR MANUFACTURING SEMICONDUCTOR DEVICE, AND SEMICONDUCTOR DEVICE

(75) Inventors: Michiko Takei, Nara (JP); Kazuhide Tomiyasu, Tenri (JP); Yasumori Fukushima, Sakurai (JP); Yutaka Takafuji, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 517 days.

(21) Appl. No.: 12/162,568

(22) PCT Filed: Dec. 13, 2006

(86) PCT No.: PCT/JP2006/324845
§ 371 (c)(1),
(2), (4) Date: Jul. 29, 2008

(87) PCT Pub. No.: WO2007/111008
PCT Pub. Date: Oct. 4, 2007

(65) Prior Publication Data
US 2009/0001504 A1   Jan. 1, 2009

(30) Foreign Application Priority Data
Mar. 28, 2006  (JP) .................... 2006-089402

(51) Int. Cl.
*H01L 21/76* (2006.01)
*H01L 21/30* (2006.01)
*H01L 21/31* (2006.01)

(52) U.S. Cl. ........ 438/406; 438/458; 438/459; 438/763; 257/E21.6

(58) Field of Classification Search .............. 438/406, 438/458, 459, 763; 257/E21.6
See application file for complete search history.

(56) References Cited

U.S. PATENT DOCUMENTS

| 6,140,210 | A | 10/2000 | Aga et al. |
| 7,902,038 | B2* | 3/2011 | Aspar et al. .................. 438/455 |
| 2004/0187766 | A1* | 9/2004 | Letertre .......................... 117/11 |
| 2005/0098827 | A1 | 5/2005 | Kanegae |
| 2005/0214984 | A1 | 9/2005 | Maruyama et al. |
| 2006/0043485 | A1 | 3/2006 | Fukushima et al. |
| 2007/0292997 | A1 | 12/2007 | Maruyama et al. |

FOREIGN PATENT DOCUMENTS

| JP | 04-354371 | 12/1992 |
| JP | 2001-051296 | 2/2001 |
| JP | 2001-127149 | 5/2001 |
| JP | 2005-026472 | 1/2005 |

OTHER PUBLICATIONS

Utsunomiya, T. et al., SUFTLA (Surface Free Technology by Laser Ablation/Annealing), AM-LCD '02, pp. 37-40.
International Search Report for PCT/JP2006/324845, mailed Mar. 20, 2007.

* cited by examiner

*Primary Examiner* — Ngan Ngo
(74) *Attorney, Agent, or Firm* — Nixon & Vanderhye, P.C.

(57) ABSTRACT

A transistor formed on a monocrystalline Si wafer is temporarily transferred onto a first temporary supporting substrate. The first temporarily supporting substrate is heat-treated at high heat so as to repair crystal defects generated in a transistor channel of the monocrystalline Si wafer when transferring the transistor. The transistor is then made into a chip and transferred onto a TFT substrate. In order to transfer the transistor which has been once separated from the monocrystalline Si wafer, a different method from a stripping method utilizing ion doping is employed.

11 Claims, 4 Drawing Sheets

METHOD FOR TRANSFERRING SEMICONDUCTOR ELEMENT, METHOD FOR MANUFACTURING SEMICONDUCTOR DEVICE, AND SEMICONDUCTOR DEVICE

This application is the U.S. national phase of International Application No. PCT/JP2006/324845, filed 13 Dec. 2006, which designated the U.S. and claims priority to Japan Application No. 2006-89402, filed 28 Mar. 2006, the entire contents of each of which are hereby incorporated by reference.

TECHNICAL FIELD

The present invention relates to a method for transferring a semiconductor element, a method for manufacturing a semiconductor device, and the semiconductor device. More specifically, the present invention relates to (I) a method for transferring a semiconductor element, the method including forming a chip from a semiconductor element formed on a semiconductor substrate and transferring the semiconductor element onto a substrate (such as a glass substrate) having a low heat resistance, (II) a method for manufacturing a semiconductor device, the method utilizing the method for transferring a semiconductor element, and (III) a semiconductor device.

BACKGROUND ART

As an art for forming a semiconductor element on an insulating substrate, the following art has been studied recently; a transistor (such as a semiconductor transistor) composed of a monocrystalline silicon thin film (hereafter, referred to as "monocrystalline Si thin film") is formed on a semiconductor substrate in advance, then the transistor is bonded onto a (insulating) substrate on which the transistor is finally mounted, which substrate is a so-called production substrate and is a glass substrate etc., and the semiconductor substrate is then cleaved and stripped off to be separated from the transistor thereby attaining a thin film (see, for example, Patent Documents 1 and 2 and Non-Patent Document 1).

Especially, for the sake of easy microfabrication of monocrystalline silicon, a transistor composed of a monocrystalline silicon thin film (hereafter, referred to as "monocrystalline Si transistor") is preferably formed by performing on a monocrystalline Si substrate (monocrystalline Si wafer) formation of a gate electrode and impurity ion doping for forming a source/drain, compared to performing the formation of the transistor after forming a monocrystalline Si thin film on a production substrate.

The monocrystalline Si transistor is initially formed on a monocrystalline Si substrate. Then the monocrystalline Si transistor formed on the monocrystalline Si substrate is bonded onto the production substrate, in such a manner that the monocrystalline Si substrate is on the outer side. Then, the monocrystalline Si substrate is stripped off from the monocrystalline Si transistor. In this way, the monocrystalline Si transistor is transferred from the monocrystalline Si substrate onto the production substrate.

As for a method for stripping the monocrystalline Si substrate off from the monocrystalline Si transistor bonded onto the production substrate, the so-called Smart-Cut® method is generally employed. According to the Smart-Cut method, doping a predetermined concentration of hydrogen ions or noble gas ions into the monocrystalline Si substrate causes microbubbles in a doping section of the monocrystalline Si substrate. The monocrystalline Si substrate is cleaved at a layer of the microbubbles, utilizing the layer as a cleaved surface (see Patent Documents 1 and 2).

More specifically, after forming the monocrystalline Si transistor on the monocrystalline Si substrate, hydrogen ions are doped into the monocrystalline Si substrate, thereby forming a hydrogen ion doping layer with a predetermined depth from the surface of the monocrystalline Si substrate. Then, the monocrystalline Si substrate is bonded onto the production substrate and is heat-treated. As a result, the monocrystalline Si substrate is separated at the hydrogen ion doping layer, thereafter being stripped from the monocrystalline Si transistor.

Patent Document 1

Japanese Unexamined Patent Publication No. 102848/1999 (Tokukaihei 11-102848, Publication date: Apr. 13, 1999)
Patent Document 1 corresponds to U.S. Pat. No. 6,140,210 (Registration date: Oct. 31, 2000).

Patent Document 2

Japanese Unexamined Patent Publication No. 2005-26472 (Tokukai 2005-26472, Publication date: Jan. 27, 2005)

Non-Patent Document 1

S. Utsunomiya et al., "Surface Free Technology by Laser Ablation/Annealing," AM-LCD '02, pp. 37-40

DISCLOSURE OF INVENTION

In the art such that ions for causing cleavage are doped and an unnecessary part is stripped at the ion doping layer from the monocrystalline Si substrate, the monocrystalline Si substrate after the cleaving-off of the unnecessary part has such problems that an area having a crystal defect (damaged area) is caused in a transistor channel of the monocrystalline Si substrate by lattice imperfection due to ion doping, unpaired electrons due to breaking a bond between Si atoms, and the like. Due to a defect that the monocrystalline Si transistor has an electric charge in such a damaged area, characteristics of the monocrystalline Si transistor are degraded. This leads to an increase in an S (subthreshold) coefficient (i.e., leads to a more gradual subthreshold slope).

However, a strain point of a grass substrate, which is generally used as a production substrate, is approximately in a range of 600° C. to 650° C.

Therefore, a glass substrate cannot be used as an insulating wafer in such a method as described in Patent Document 1 in which, after bonding one Si wafer to another Si wafer having an ion doping layer or, alternatively, bonding an Si wafer having an ion doping layer to an insulating wafer and the Si wafer having an ion doping layer is cleaved by the Smart-Cut method, and before or after the cleaving, heat treatment is performed on the wafers in order to increase a bonding strength therebetween, thereby obtaining an SOI wafer, and a defective layer of the SOI wafer due to ion doping is removed by vapor-phase etching.

On the other hand, as described in Patent Document 2, the applicants of the present invention take such measures that an oxide film is temporarily formed on the stripped surface and is then removed therefrom, thereby removing the damaged layer on the stripped surface. In order to form the oxide film, employed are high-pressure steam oxidation etc., in which a temperature of oxidation treatment is relatively low. This makes it possible to transfer a semiconductor element onto a glass substrate having a low strain point.

By employing the method, a glass substrate having a low strain point can be used as an article to which a semiconductor element is transferred, in other words, as a production substrate.

However, the inventors of the present invention were not fully satisfied with the result above, but, in order to provide a semiconductor device having a semiconductor element of higher performance on an insulating substrate which has a low heat resistance, such as a glass substrate, the inventors diligently studied on how to prevent by a different method from that of Patent Document 2 characteristic degradation of a semiconductor element caused by a crystal defect which is inevitably generated in a transistor channel of the semiconductor element when transferring the semiconductor element from a semiconductor substrate on which the semiconductor element is formed.

That is, in view of the problem, an object of the present invention is to provide (a) a method for transferring a semiconductor element which method makes it possible to prevent characteristic degradation of the semiconductor element inevitably caused by a crystal defect which is inevitably generated in a transistor channel of the semiconductor element by transferring the semiconductor element from a semiconductor substrate on which the semiconductor element is formed, (b) a method for manufacturing a semiconductor device, the method utilizing the method for transferring a semiconductor element, and (c) a semiconductor device.

In order to solve the problem, a method for transferring a semiconductor element is a method, in which, from a semiconductor substrate (A) on which the semiconductor element is formed, a transferring layer including the semiconductor element is separated by doping hydrogen ions or noble gas ions in the semiconductor substrate (A), and then heat-treating the semiconductor substrate (A), so as to make a chip of the semiconductor element, and the chip of the semiconductor element is transferred onto a substrate (B) on which the semiconductor element is finally mounted, the method including: (i) the ion doping step of doping hydrogen ions or noble gas ions in an interface of transferring layer of the semiconductor substrate (A) on which the semiconductor element is formed; (ii) the first transfer step of transferring the semiconductor element onto a temporary supporting substrate (C) in such a manner that the semiconductor substrate (A) on which the semiconductor element is formed is bonded onto the temporary supporting substrate (C) with the semiconductor element sandwiched therebetween and the semiconductor substrate (A) and temporary supporting substrate (C) thus bonded are heat-treated so as to separate the transferring layer to the temporary supporting substrate (C) from the semiconductor substrate (A), the temporary supporting substrate (C) having an upper temperature limit equal to or higher than a temperature for repairing crystal defects generated in a transistor channel of the semiconductor element due to the separation (namely, due to, as described above, the separation, utilizing hydrogen ions or noble gas ions, of the transferring layer including the semiconductor element from the semiconductor substrate (A)); (iii) the crystal defect repairing step of repairing the crystal defects by heat-treating the temporary supporting substrate (C) on which the semiconductor element is transferred, at a temperature equal to or higher than the temperature for repairing crystal defects which are generated in the transistor channel of the semiconductor element; and (iv) the final transfer step of making the semiconductor element into the chip and transferring the chip of the semiconductor element onto the substrate (B) by a different method from the first transfer step.

In other words, the method for transferring a semiconductor element is a method such that the semiconductor element formed on the semiconductor substrate (A), namely, the semiconductor element built on the semiconductor substrate (A) is made into a chip and is transferred onto the substrate (B) on which the semiconductor element is finally mounted. In the method for transferring a semiconductor element, the semiconductor element formed on the semiconductor substrate (A) is temporarily transferred onto the temporary supporting substrate (C). The temporary supporting substrate (C) is then heat-treated at a high heat so as to repair the crystal defect generated in the transistor channel of the semiconductor element when the semiconductor element is transferred onto the temporary supporting substrate (C). The semiconductor element is made into a chip, thereafter being transferred onto the substrate (B). The "transferring a semiconductor element" here means to move the semiconductor element from one substrate to the other substrate, in other words, to separate the semiconductor element from the one substrate and bond (mount) the semiconductor element onto the other substrate.

As for re-transfer (i.e., re-separation and re-bond) of the semiconductor element separated from the semiconductor substrate (A) which has been used to form the semiconductor element, a different method from the described method utilizing ion doping for the separation (stripping an unnecessary part) can be employed as a method for separating the semiconductor element. Therefore, the different method from the first transfer step, namely, the transfer method utilizing ion doping is employed for the re-transfer of the semiconductor element which semiconductor element has been transferred from the semiconductor substrate (A) onto the temporary supporting substrate (C) and heat-treated so as to repair a crystal defect.

There is no special limitation to a method such that the temporary supporting substrate (C) onto which the semiconductor element has been transferred is heat-treated so as to repair the crystal defect and the semiconductor element is made into a chip, thereafter being transferred onto the substrate (B) by a different method from the transfer method utilizing ion doping. A variety of conventional transfer methods can be employed as the method. In the method, for example, the following first to third methods can be preferably employed. The following methods can be used in combination.

The first method includes, for example, after the steps between the first transfer step and the final transfer step, a re-transfer step of transferring the semiconductor element at least once onto a temporary supporting substrate (D) in such a manner that the temporary supporting substrate (C) is bonded onto the temporary supporting substrate (D) having a layer (a) made of hydrogenated amorphous silicon or porous silicon, with the semiconductor element sandwiched therebetween, and then the temporary supporting substrate (C) is removed by etching, the final transfer step including: making the chip with the semiconductor element and the temporary supporting substrate (D) on which the semiconductor element is transferred; bonding the chip onto the substrate (B) in such a manner that the temporary supporting substrate (D) is bonded onto the substrate (B) with the semiconductor element sandwiched therebetween; and removing the temporary supporting substrate (D) by heat-treating the layer (a) or by laser irradiation thereto, so as to transfer the chip of the semiconductor element onto the substrate (B).

The second method includes, for example, after the steps between the first transfer step and the final transfer step, a re-transfer step of transferring the semiconductor element at least once onto a temporary supporting substrate (D) in such a manner that the temporary supporting substrate (C) is bonded onto the temporary supporting substrate (D) which is different from the temporary supporting substrate (C), with the semiconductor element sandwiched therebetween, and the temporary supporting substrate (C) is removed by etching, the final transfer step including: making the chip with the semiconductor element and the temporary supporting substrate (D) on which the semiconductor element is transferred; bonding the chip with the substrate (B) in such a manner that the temporary supporting substrate (D) is bonded onto the substrate (B) with the semiconductor element sandwiched therebetween; and removing the temporary supporting substrate (D) by etching, so as to transfer the chip of the semiconductor element onto the substrate (B).

The third method is, for example, such that the final transfer step includes: making the chip with the semiconductor element and the temporary supporting substrate (C) on which the semiconductor element is transferred; bonding the chip with the substrate (B) in such a manner that the temporary supporting substrate (C) is bonded onto the substrate (B) with the semiconductor element sandwiched therebetween; and removing the temporary supporting substrate (C) by etching, so as to transferring the chip of the semiconductor element onto the substrate (B).

In the crystal defect repairing step, a temperature of heat treatment is preferably 700° C. or higher and is especially preferably in a range of 700° C. to 900° C.

The present invention is suitable for a case where an upper temperature limit of the substrate (B) is lower than a temperature for repairing a crystal defect generated in the transistor channel of the semiconductor element. As the substrate (B), for example, a glass substrate and a plastic substrate can be used.

Also, the present invention is suitable for a case where the semiconductor element is a semiconductor transistor.

According to the method for transferring a semiconductor element, the semiconductor element formed on the semiconductor substrate (A) is not directly transferred onto the substrate (B). Alternatively, before transferring the semiconductor element onto the substrate (B), the semiconductor element is temporarily transferred onto the temporary supporting substrate (C) having an upper temperature limit equal to or higher than a temperature for repairing a crystal defect generated in the transistor channel of the semiconductor element by the separation. As a result, the crystal defects generated by the separation in the transistor channel of the semiconductor element can be repaired through the heat treatment at a temperature equal to or higher than a temperature for repairing a crystal defect.

Moreover, according to the method above, a damaged layer which is made after stripping an unnecessary part from the semiconductor substrate (A) and has the crystal defect (lattice imperfection) in the transistor channel is not removed, but the crystal defect (lattice imperfection) itself in the transistor channel can be repaired. This can fundamentally improve transistor characteristics affected by the crystal defect.

As a result, by employing for the manufacture of a semiconductor device the method for transferring a semiconductor element, the present invention can provide a semiconductor device having improved semiconductor characteristics than ever, especially, a semiconductor device having a significantly lower S coefficient than the conventional arts.

In short, the method for manufacturing a semiconductor device is a method including a step for transferring by the method for transferring a semiconductor element a semiconductor element onto the substrate (B) which is used in a semiconductor device.

That is, the method for manufacturing a semiconductor device includes a transferring step of transferring a semiconductor element onto the substrate (B) to be used in the semiconductor device by a transferring method for transferring the semiconductor device, in which transferring method from a semiconductor substrate (A) on which the semiconductor element is formed, a transferring layer including the semiconductor element is separated by doping hydrogen ions or noble gas ions in the semiconductor substrate (A), and then heat-treating the semiconductor substrate (A), so as to make a chip of the semiconductor element, and the chip of the semiconductor element is transferred onto a substrate (B) on which the semiconductor element is finally mounted wherein the transferring method includes the steps (i) to (iv).

The semiconductor device is fabricated by transferring by the method for transferring a semiconductor element, a chip of a semiconductor element onto the substrate (B) on which the semiconductor element is finally mounted, the semiconductor element being a semiconductor transistor and having an S coefficient of 65 mV/decade or less. In other words, in the first transfer step, which is a temporary transfer, crystal defects generated in a transistor channel of the semiconductor element are repaired and the semiconductor device is fabricated by finally transferring the chip of the semiconductor element onto the substrate (B) by a method that is different from the separation (stripping-off) of an unnecessary part through ion doping.

The method for transferring a semiconductor element preferably includes, before the first transfer step, forming a silicon oxide film on the semiconductor element.

The transferring layer and each substrate preferably have a transfer surface having a flatness Rms of 0.5 nm or less and a waviness of 30 μm or less, the transfer surface of each substrate being a surface to which the transferring layer is to be bonded by the transferring.

According to the methods above, the present invention can improve a bonding strength between the transfer surface of the transferring layer and the transfer surface of each substrate which transfer surface is to be bonded onto the transferring layer by the transfer. As a result, both substrates, for example, can be bonded to each other without an adhesive.

BRIEF DESCRIPTION OF DRAWINGS (a) to (n) of FIG. 1 are cross-sectional views illustrating manufacturing steps of a semiconductor device of an embodiment of the present invention.

Figure 4:
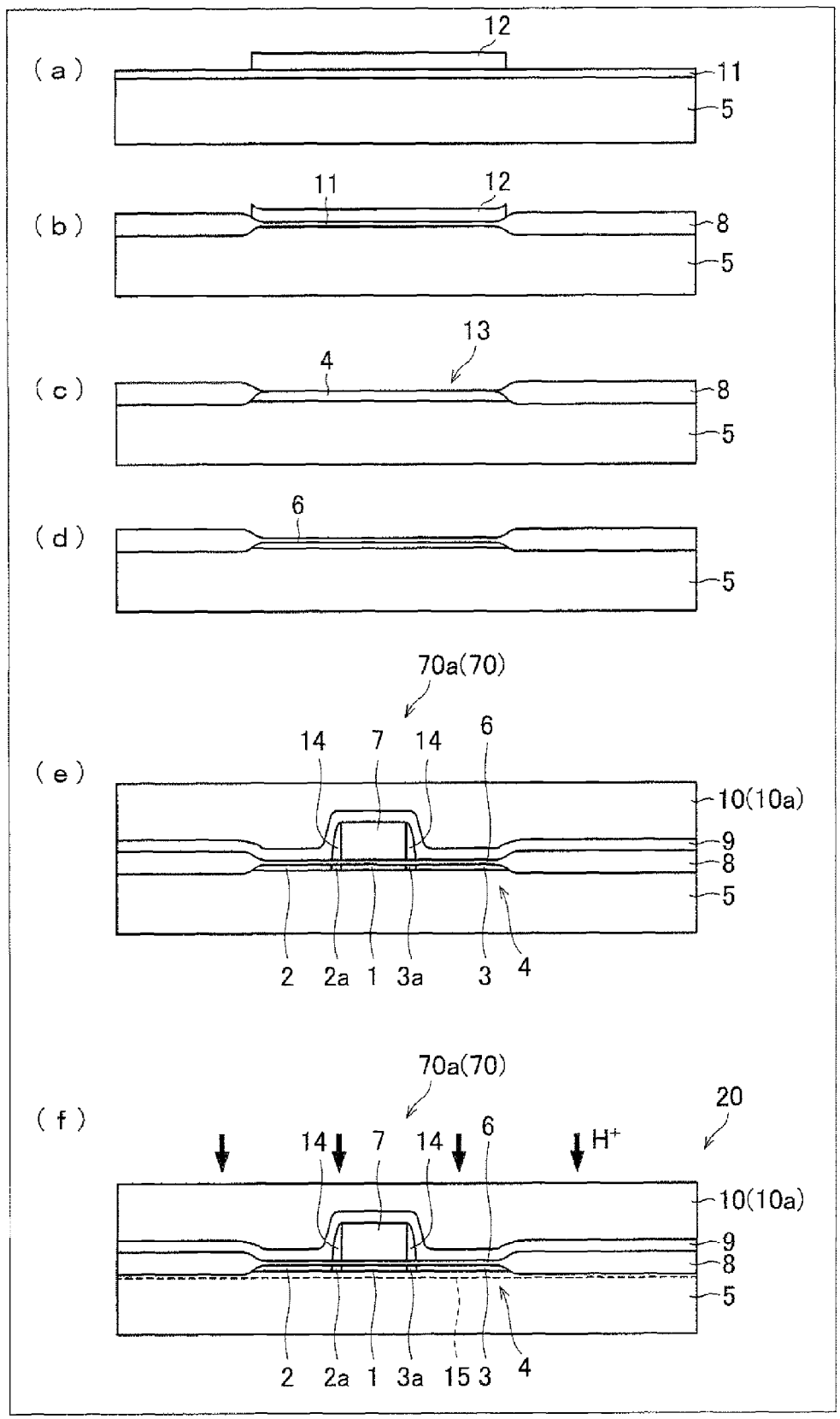

(a) to (f) of FIG. 4 are cross-sectional views illustrating steps of forming on a semiconductor substrate the semiconductor element which is transferred onto the semiconductor device of the embodiment of the present invention.

Figure 5:
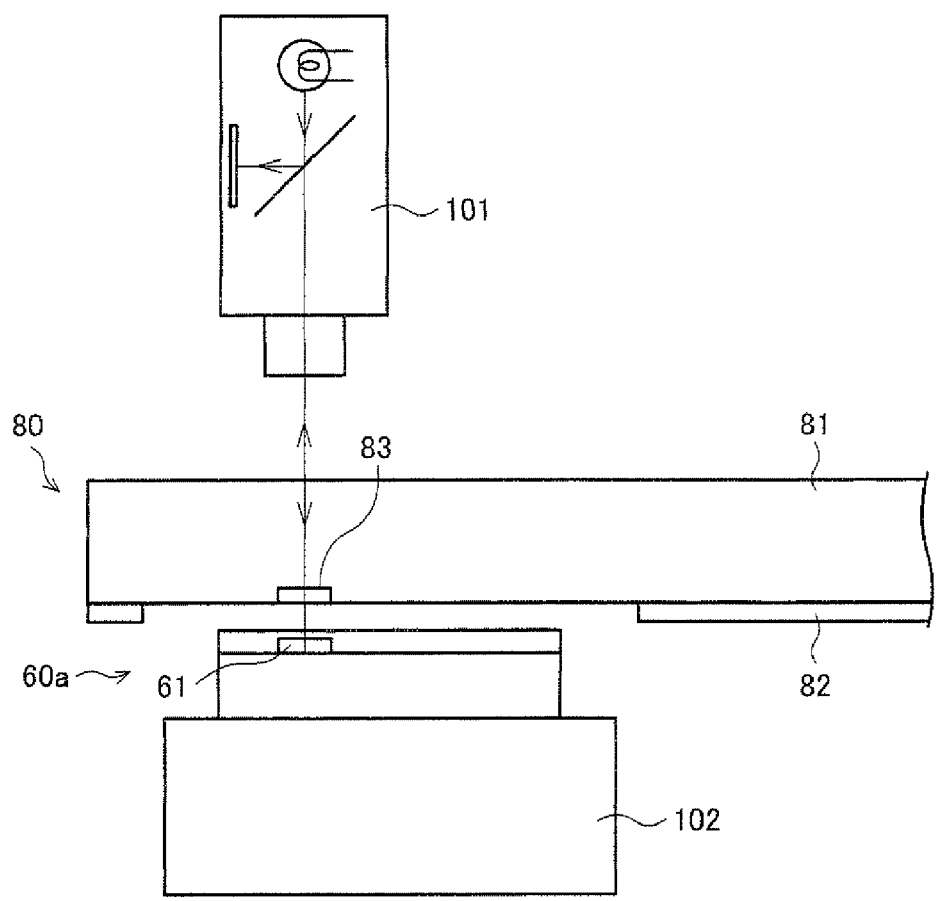

FIG. 5 is a cross-sectional view illustrating a method for alignment when transferring the semiconductor element onto a TFT substrate.

Figure 6:
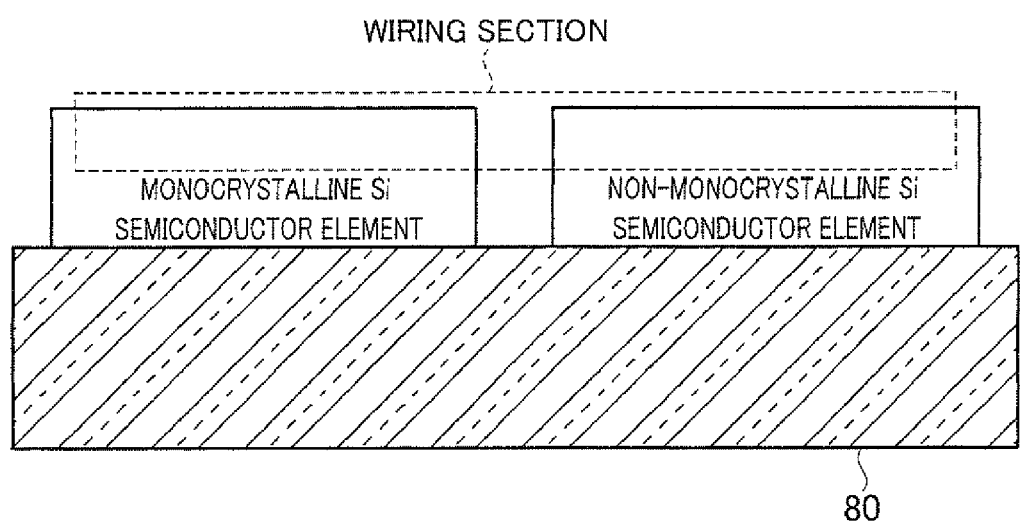

FIG. 6 is a cross-sectional view illustrating a schematic structure of the semiconductor device such that a monocrystalline Si semiconductor element and a non-monocrystalline Si semiconductor element co-exist on the TFT substrate.

EXPLANATION OF LETTERS AND NUMERALS

1 Channel region
2 Source region
2a Low-concentration impurity region
3 Drain region
3a Low-concentration impurity region
4 Active layer
5 Monocrystalline Si wafer (semiconductor substrate (A))
6 Gate insulating film
7 Gate electrode
8 LOCOS film
9 NSG film
10 Planarized oxide film
12 SiN film
13 Element region
14 Side wall
15 Ion doping layer
20 Device substrate
22 Source electrode
23 Drain electrode
24 Contact hole
25 Contact hole
26 Contact hole
30 First temporary supporting substrate (temporary supporting substrate (C))
31 Monocrystalline Si wafer
32 Thermally-oxidized film
40 Transistor substrate
41 TEOS film
50 Second temporary supporting substrate (temporary supporting substrate (D))
51 Monocrystalline Si wafer
52 a-SiH layer (layer (a))
60 Transistor substrate
60a Transistor substrate
70 Transistor (semiconductor element)
70a Monocrystalline Si transistor (semiconductor element)
80 TFT substrate (substrate (B))
81 Insulating substrate (substrate (B))
82 Wiring layer
91 Protective insulating film
92 Metal wiring layer
100 Semiconductor device

BEST MODE FOR CARRYING OUT THE INVENTION

An embodiment of the present invention is described below with reference to (a) to (n) of FIG. 1 and FIG. 6.

A semiconductor device of the present invention is a semiconductor device utilizing an insulating substrate having a low heat resistance as a substrate onto which a semiconductor element such as a semiconductor transistor is finally transferred (moved), namely, as a substrate which is finally used for, for example, a display apparatus and is a so-called production substrate. The insulating substrate is a substrate such as a glass substrate and has been conventionally difficult to apply.

In the present embodiment, described below as an example of the semiconductor device of the present embodiment is a semiconductor device having a structure in which a chip-type semiconductor transistor, which is the semiconductor element above, has been transferred onto a substrate formed (TFT substrate) on which a pixel area has been formed. However, the present invention is not limited to this. As illustrated in FIG. 6, the semiconductor device is preferably arranged such that a MOS non-monocrystalline silicon thin film transistor (non-monocrystalline Si semiconductor element) and a MOS monocrystalline silicon thin film transistor (monocrystalline Si semiconductor element) are each formed in different regions on an insulating substrate 81 such as a glass substrate. The semiconductor device is suitable for realizing higher performance/functionality.

A MOS semiconductor transistor has an active semiconductor layer, a gate electrode (gate), a gate insulating film, and high-concentration impurity doping sections (source/drain) formed on the both sides of the gate. The MOS semiconductor transistor is a general transistor such that a carrier concentration in a semiconductor layer under the gate is adjusted by the gate, whereby an electric current between the source and the drain is controlled.

Such a MOS transistor is suitable for a low-power consumption logic because, when the MOS transistor has a CMOS (Complementary MOS) structure, the MOS transistor consumes less power and a high output can be obtained therefrom in accordance with a supply voltage.

Also in the present embodiment, the MOS transistor preferably has a CMOS (Complementary MOS) structure. However, in the present embodiment, only one MOS (Metal Oxide Semiconductor) is illustrated in figures.

Figure 2:
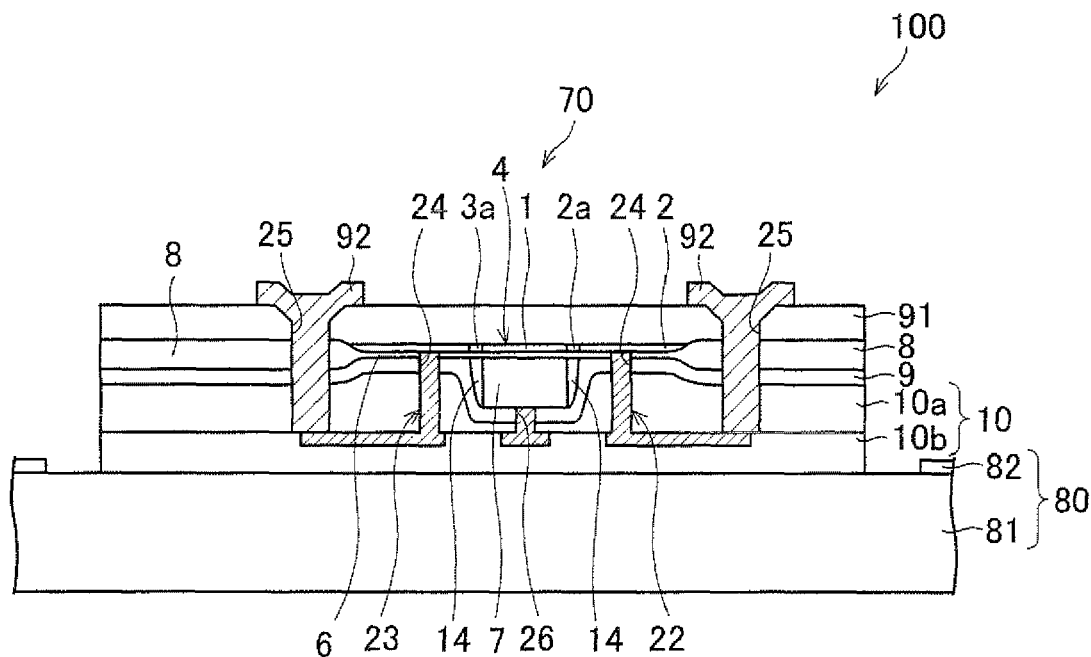
FIG. 2 is a cross-sectional view illustrating a schematic structure of the semiconductor device of the embodiment of the present invention.

As illustrated in FIG. 2, a semiconductor device 100 of the present embodiment includes on a TFT substrate 80 a MOS transistor 70 (hereafter, simply referred to as "transistor") which has been made into a chip, a protective insulating film 91, a metal wiring layer 92, etc. The TFT substrate 80 has a structure such that a wiring layer 82 is provided on the insulating substrate 81.

Figure 3:
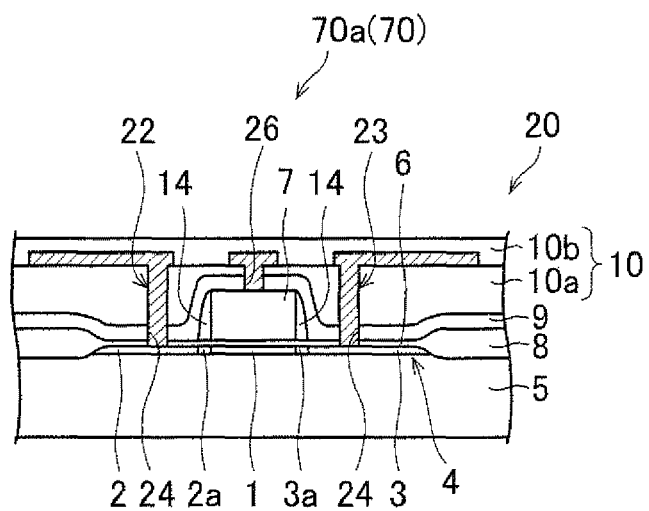
FIG. 3 is a cross-sectional view illustrating a schematic structure of a semiconductor element which is transferred onto the semiconductor device of the embodiment of the present invention.

As illustrated in FIGS. 2 and 3, the transistor 70 includes a monocrystalline Si (silicon) wafer (hereafter, referred to as "monocrystalline Si wafer") 5 which is a monocrystalline Si substrate including an active layer 4, a gate insulating film 6 formed on the monocrystalline Si wafer 5, a gate electrode 7 (gate) formed on the gate insulating film 6, a source electrode 22 and a drain electrode 23 connected to the source region 2 and the drain region 3 respectively, a LOCOS (Local Oxidation of Silicon) film 8 (field oxide film) whose film thickness is thicker than the gate insulating film 6 which LOCOS film 8 is formed on the monocrystalline Si wafer 5 around the active layer 4, an NSG (Non-doped Silicate Grass) film 9 which is an oxide film formed on the gate electrode 7 and the LOCOS film 8, and a silicon dioxide ($SiO_2$) film (hereafter, referred to as "TEOS film") which is an oxide film 10 which has been planarized (hereafter, referred to as "planarized oxide film") and is made TEOS (ethyl orthosilicate; $Si(OC_2H_5)_4$). The active layer 4 includes a channel region 1, a source region 2 (source), and a drain region 3 (drain). In the present embodiment, the planarized oxide film 10 has two layers (planarized oxide films 10a and 10b).

The active layer 4 has shallow element regions in which reverse conducting dopant is doped. For threshold control, the element regions respectively have a section in which $N^+$ or $P^+$ dopant is doped, which section is the source region 2 or the drain region 3.

That is, the transistor 70 of the present embodiment has an LLD (Lightly doped drain) structure, in which the monocrystalline Si wafer 5 is fabricated as follows: The channel region 1 is formed under the gate electrode 7. Low-concentration impurity regions 2a and 3a are formed in regions adjacent to the channel region 1. In outer regions of the low-concentration impurity regions 2a and 3a, the source region 2 and the drain region 3 are formed which are connected to the source electrode 22 and the drain electrode 23, respectively. Note that the LLD structure is not essential in the present invention.

The NSG film 9 (oxide film) is formed by CVD (chemical vapor deposition) so as to cover all the top surfaces of the gate insulating film 6 and the gate electrode 7. The surface of the planarized oxide film 10 is planarized through, for example, a CMP (Chemical Mechanical Polishing) process etc.

The LOCOS film 8 is a film formed as a device separation region. The LOCOS film 8 can be formed by LOCOS method. For element separation, the LOCOS film 8 is thus formed as a thick thermally-oxidized film (field oxide film) around the active layer 4.

As illustrated in FIGS. 2 and 3, the source electrode 22 and the drain electrode 23 are respectively connected to the source region 2 and the drain region 3 through contact holes 24 which are the connecting holes formed through the gate insulating film 6 and the NSG film 9. As illustrated in FIG. 2, the protective insulating film 91 is formed on the active layer 4 and the LOCOS film 8. On the protective insulating film 91, the metal wiring layers 92 are formed so as to be respectively connected to the source electrode 22 and the drain electrode 23 through contact holes 25 which are the connecting holes formed through the protective insulating film 91, the LOCOS film 8, and the NSG film 9. The metal wiring layers 92 are used as, for example, a source wiring and a drain wiring. In addition, a contact hole not illustrated in FIG. 2 (i.e., another contact hole 25 not illustrated in FIG. 2) is formed on the protective insulating film 91. The contact hole not illustrated is a connecting hole formed through the protective insulating film 91, the LOCOS film 8, and the NSG film 9. Furthermore, a metal wiring layer not illustrated in FIG. 2 (i.e., another metal wiring layer 92 not illustrated in FIG. 2) is formed on the protective insulating film 91. The metal wiring layer not illustrated is connected to the gate electrode 7 (gate) through a contact hole 26 which is a connecting hole formed in an area of the NSG film 9 which area is opposite to the gate electrode 7 (gate).

The active layer 4 of the transistor 70 is a semiconductor. The active layer 4 is not especially limited to a specific material as long as the active layer 4 is a semiconductor. Specifically, the active layer 4 is a semiconductor of polycrystalline, monocrystalline, or the like composed of Si, Ge, GaAs, GaP, CdS, CdSe, or the like.

The planarized oxide film 10 is not limited to the TEOS film, but may be an $SiO_2$ film, a phosphorus silicate glass (PSG) film, a boron phosphorus silicate glass (BPSG), or the like.

As described, the semiconductor device 100 can include both a MOS non-monocrystalline silicon thin film transistor (non-monocrystalline Si semiconductor element) and a MOS monocrystalline silicon thin film transistor (monocrystalline Si semiconductor element) on the insulating substrate 81, namely, on one TFT substrate 80.

A distance between a region for forming the non-monocrystalline Si semiconductor element and a region for forming the monocrystalline Si semiconductor element is at least 0.3 µm or more, or preferably 0.5 µm or more. This can prevent metal atoms such as Ni, Pt, Sn, and Pd from diffusing in the monocrystalline Si semiconductor element. As a result, stable properties of the monocrystalline Si semiconductor element can be attained.

Furthermore, the semiconductor device 100 of the present embodiment preferably includes an $SiO_2$ film which is an interlayer insulating film between the non-monocrystalline Si semiconductor element and the monocrystalline Si semiconductor element. This makes it possible prevents contamination of the monocrystalline Si thin film semiconductor element.

In a case where the semiconductor device 100 is used for a liquid crystal display apparatus, the semiconductor device 100 further includes SiNx (silicon nitride), a planarized resin film, a via hole, and a transparent electrode so as to allow liquid crystal display operation. In addition, in the region for forming the non-monocrystalline Si semiconductor element, a driver and a TFT for a display section are formed. Furthermore, in the region for forming the monocrystalline Si semiconductor element which is adaptive to a device required to have higher performance, a timing controller is formed. A driver section may be a monocrystalline Si semiconductor element. This may be determined in consideration of cost and performance.

The TFT substrate 80 onto which the transistor 70 is bonded is a substrate for mounting a transistor thereon which substrate is made by forming the wiring layer 82 on the insulating substrate 81. In the manufacturing process of the TFT substrate 80, the TFT substrate 80 is referred to as production substrate (hereafter, referred to as "substrate (B)"). The TFT substrate 80 is, for example, a circuit substrate having a pixel area etc. or the like. Such a circuit substrate is used for an active-matrix display apparatus.

The insulating substrate 81 used for the TFT substrate 80 is a substrate such as a glass substrate, a plastic substrate, a so-called thin film, a so-called metal film, and the like. These substrates have been difficult to use for the manufacture of devices because the substrates generally have a low heat resistance. The insulating substrate 81 itself may have insulation properties. Moreover, the insulating substrate 81 may have a structure such that an insulating layer is provided on a substrate as a base. Thickness of the insulating substrate 81 is not especially limited, but may be set according to a material of a substrate, purpose of use, etc.

The insulating substrate 81 is not especially limited, but, specifically, in the application of the present invention, the insulating substrate 81 is preferably a substrate whose upper temperature limit is less than 700° C. On the surface of the insulating substrate 81, patterns such as wiring patterns are formed.

In the present embodiment, an upper temperature limit of a glass substrate means a strain point.

The plastic substrate is not especially limited, but is a polyethersulfone substrate etc., for example. The plastic substrate preferably has light transmission properties. More preferably, the plastic substrate is a transparent plastic substrate.

The thin film above has flexibility so as to fold, bend, and/or freely change the shape thereof and does not crash when dropped. A general-purpose thin film such as an organic film can be used here.

The metal film above is non-transparent and electrically conductive. Specifically, an example of the metal film is a stainless film. When the base substrate of the TFT substrate 80 is a metal film, a layer having insulation properties, such as $SiO_2$, is provided on the surface of the metal film.

According to the present embodiment, by using an insulating substrate having light transmission properties, such as a glass substrate, as the insulating substrate 81, which is a production substrate on which the transistor 70 is finally mounted, the semiconductor device 100 thus obtained can be suitably applied to, for example, a liquid crystal display apparatus.

As described above, the insulating substrate 81 (transparent substrate) made a material having light transmission properties such as a glass substrate has high light transmission properties. Therefore, the insulating substrate 81 can be suitably applied to, for example, a liquid crystal display apparatus. On the other hand, the insulating substrate 81 has a low strain point. As a result, it has been conventionally difficult to form a semiconductor device 100 having a low S coefficient (subthreshold coefficient).

However, according to the present embodiment, it is possible to provide a semiconductor device 100 having a low S coefficient, the semiconductor element 100 having a transistor 70, whose performance is higher than ever, on the insulating substrate 81 thus having a low heat resistance.

Among the materials mentioned above, the insulating substrate 81 of the present embodiment is preferably a glass substrate or a plastic substrate.

Figure 1:
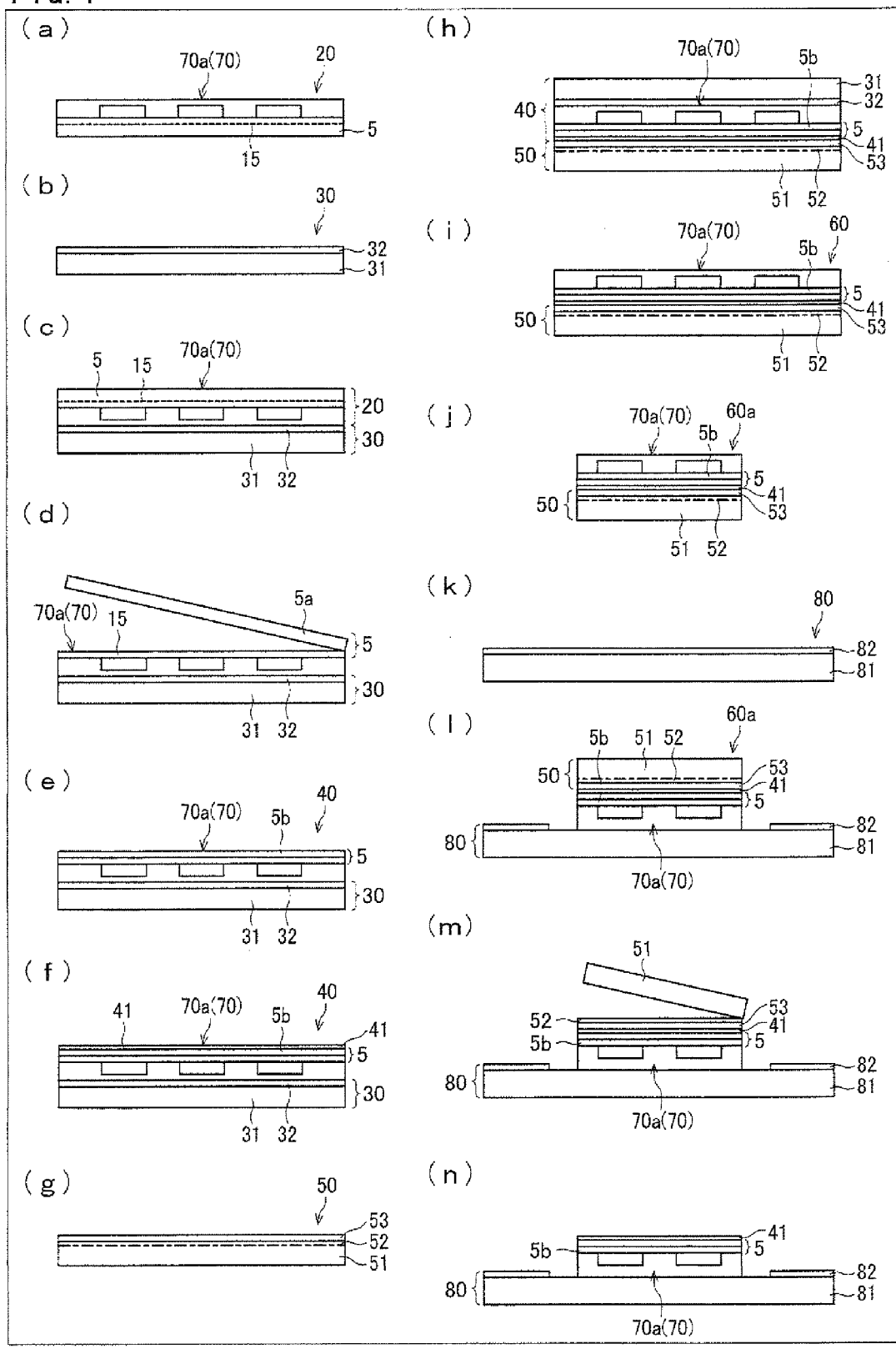

The following describes a method for manufacturing the semiconductor device 100 of the present embodiment, with reference to (a) to (n) of FIG. 1, FIGS. 2, 3, (a) to (f) of FIG. 4, and FIG. 5.

In the present embodiment, the following describes the formation of a monocrystalline Si thin film transistor 70a illustrated in FIG. 3, which is equivalent to the transistor 70. However, the present invention is not limited to the description.

The following also describes in detail the method for manufacturing the semiconductor device 100, showing concrete numeric values used in the manufacture of the semiconductor device 100. However, the present invention is not limited to concrete examples below.

The following provides a concrete example of the method for manufacturing the semiconductor device 100 of the present embodiment. A device substrate is made by building the monocrystalline Si thin film transistor 70a as the transistor 70 onto a semiconductor substrate (wafer) which is a base substrate, specifically onto the monocrystalline Si wafer 5 (monocrystalline Si substrate). The monocrystalline Si thin film transistor 70a thus formed on the device substrate is transferred at least twice from the device substrate to a temporary supporting substrate and is made into a chip. The monocrystalline Si thin film transistor 70a is transferred onto the TFT substrate 80 which is a production substrate on which the monocrystalline Si thin film transistor 70a is finally mounted. It should be noted that the present invention is not limited to this example.

The monocrystalline Si thin film transistor 70a of the present embodiment is formed on the monocrystalline Si wafer 5 before being bonded onto the TFT substrate 80. After being made into a chip, the monocrystalline Si thin film transistor 70a is bonded onto the TFT substrate 80. It is easier to perform the microfabrication of a monocrystalline Si thin film when performing on the monocrystalline Si wafer 5 the formation of the gate electrode 7 and the dopant ion doping for forming a source/drain, than when performing the formation of the monocrystalline Si thin film transistor 70a after forming a monocrystalline Si thin film on the insulating substrate 81 of the TFT substrate 80.

The following describes steps for manufacturing the device substrate with reference to FIGS. 2, 3, and (a) to (f) of FIG. 4.

In the present embodiment, a substrate used for a device substrate 20 as illustrated in FIG. 3 and (a) to (f) of FIG. 4 (hereafter, the substrate is referred to as "semiconductor substrate (A)"), in other words, a base substrate (wafer) to form a transistor is not especially limited to a specific substrate as long as the substrate can be used for the formation of the transistor. However, normally used is a substrate having a heat resistance in a range of 700° C. to 1400° C. Specifically, for example, such a base substrate is an Si substrate such as a monocrystalline Si wafer (monocrystalline Si substrate), a GaAs substrate, or the like.

A size of a wafer (base substrate), the wafer used for the device substrate, is not especially limited, but, a large diameter is preferable because more transistors can be formed and therefore the cost of manufacturing the device substrate 20 and, moreover, the cost of manufacturing the semiconductor device 100 can be reduced.

As described, in the present embodiment, the monocrystalline Si wafer 5 is used as the base substrate. According to a conventional method, a miniaturized transistor is formed on the monocrystalline Si wafer 5 so as to form that monocrystalline Si substrate as the device substrate 20 on which a part to be made into the transistor 70, namely, the monocrystalline Si thin film transistor is built.

The device substrate 20 of the present embodiment can be made through, for example, a common Si process. In the present embodiment, a size of a wafer is set to 6 inches (approximately 15 cm). On the whole surface of the wafer, the miniaturized transistor is formed.

Specifically, as illustrated in (a) of FIG. 4, the monocrystalline Si wafer 5 made of monocrystalline silicon is prepared and the surface thereof is oxidized so as to form a shallow $SiO_2$ (silicon dioxide) film 11, whose thickness is approximately 30 nm. Then, an SiN (silicon nitride) film 12 is deposited on the whole $SiO_2$ film 11 by plasma CVD (Chemical Vapor Deposition). The SiN film 12 is etched so that a part not to be an element region is etched away and while a part to be the element region is left.

Then, as illustrated in (b) of FIG. 4, using the SiN film 12 as a mask, an oxide film made of $SiO_2$ is developed as a field oxide film by, for example, dry oxidation. Thereby, for example, a LOCOS film 8 of 400 nm thick is formed.

Then, as illustrated in (c) of FIG. 4, the SiN film 12 is removed by etching. In order to control threshold voltage in either of an N channel region or a P channel region, boron (B) ions or phosphorus (P) ions are doped into an element region 13 surrounded by the LOCOS film 8, then, the $SiO_2$ film 11 is removed by etching.

That is, a P-type region is formed by doping boron ions into the element region 13. By doping arsenic (As) ions into the P-type region so as to form the source region 2 and the drain region 3, a N-type MOS transistor is formed. Alternatively, an N-type region is formed by doping phosphorus ions into the element region 13. By doping boron fluoride ions into the N-type region so as to form the source region 2 and the drain region 3, a P-type MOS transistor is formed.

The N-type MOS transistor and the P-type MOS transistor can be formed simultaneously. Therefore, after forming the N-type MOS transistor and the P-type MOS transistor, a CMOS transistor can be obtained.

As illustrated in FIGS. 2 and 3, the active layer 4 is a region including the channel region 1 under the gate electrode 7, the source region 2, and the drain region 3. As described, impurity ions for adjusting threshold voltage is doped into the channel region 1 under the gate electrode 7.

Then, as described in (d) of FIG. 4, $SiO_2$ having a thickness of 15 nm is developed as the gate insulating film 6 by, for example, dry oxidation.

The gate insulating film 6 and the LOCOS film 8 can be formed by also a thermal oxidation method such as a pyrogenic oxidation method or an HCl (hydrogen chloride) oxidation method. A thickness of the gate insulating film 6 is not especially limited to a specific thickness, but is generally set in a range of 3 nm to 200 nm. A thickness of the LOCOS film 8 is set, for example, to be not less than 250 nm but not more than 2000 nm.

Then, as illustrated in (e) of FIG. 4, for example, a polycrystalline silicon (hereafter, referred to as "p-Si") film approximately 300 nm thick is deposited on the gate insulating film 6. Phosphorous oxychloride (POCl$_3$) not illustrated in figures is also deposited on the gate insulating film 6. Then, diffusion is performed at a temperature of 800° C. Patterning of the gate electrode 7 is performed. In order to form low-concentration impurity regions 2a and 3a, boron ions or phosphorous ions are doped to the areas which are formed into the low-concentration impurity regions 2a and 3a. SiO$_2$ is deposited thereon up to a thickness in a range of 200 nm to 2000 nm (in the present embodiment, approximately 300 nm). Side walls 14 and 14 are formed by etch back of Reactive Ion Etching (RIE; Reactive Ion etching).

Then, arsenic ions or boron fluoride ions are doped to the areas which are formed into source/drain regions. Activation annealing is then performed at the temperature of approximately 900° C.

Then, the NSG film 9 having a thickness of 150 nm is developed by a CVD method. Furthermore, an SiO$_2$ film to be a planarized oxide film 10a (first planarized oxide film), the SiO$_2$ film having a thickness of 1 μm is formed from the TEOS on the surface of the NSG film 9 by a method of PCVD (Plasma enhanced Chemical Vapor Deposition: plasma CVD).

The surface of the SiO$_2$ film (hereafter, referred to as "TEOS film"), which SiO$_2$ film is to be the planarized oxide film 10a, is etched to a depth of 500 nm or more by a CMP method, so as to planarize the surface. In the present embodiment, the surface of the TEOS film is etched to a depth of 200 nm by CMP.

By the steps above, formed is that monocrystalline Si wafer 5 whose surface has been planarized as illustrated in FIG. 3, onto which the monocrystalline Si thin film transistor 70a has been built.

In order to make the monocrystalline Si wafer 5 into a thin film by removing an unnecessary part from the monocrystalline Si wafer 5 on which the monocrystalline Si thin film transistor 70a has been thus built, such a method is employed that ions for cleaving the monocrystalline Si wafer 5 are doped into the monocrystalline Si wafer 5 and heat treatment is performed thereon, thereby cleaving the monocrystalline Si wafer 5 so as to strip the unnecessary part at an ion doping part (ion doping surface) of the monocrystalline Si wafer 5.

Accordingly, as illustrated in (f) of FIG. 4, ions for cleaving the monocrystalline Si wafer 5 are doped therein from above the planarized oxide film 10. Thus, an ion doping layer 15 (an region where a cleavage occurs) is formed on the monocrystalline Si wafer 5.

The ions for cleaving may be conventional ions for cleaving a substrate, which are used in the Smart-Cut® method. Such ions are, for example, noble gas ions and the like, the noble gas ions such as hydrogen ions and helium ions.

As for conditions for doping ions, the ions for cleaving a substrate, conventional conditions for ion doping (conditions for cleavage) can be applied. The conditions for doping ions are not especially limited, but are set according to types etc. of ions.

In the present embodiment, hydrogen ions are used for causing the cleavage. Conditions for doping the hydrogen ions are a doping acceleration voltage of 150 KeV and a doping (dose) amount of 5×10$^{16}$/cm$^2$.

The doping acceleration voltage is for determining a cleaving position. The doping acceleration voltage is changed according to conditions required for a transistor. The doping amount is for causing the cleavage. A small doping amount does not cause a cleavage. Therefore, the doping amount need to be set in a range of 1×10$^{15}$/cm$^2$ to 1×10$^{17}$/cm$^2$. In the present embodiment, a doping energy is adjusted so that the ion doping layer 15 in the active layer 4 made of monocrystalline silicon deepens into an Si crystal of a lower part of the LOCOS film 8.

After thus forming the ion doping layer 15 on the monocrystalline Si wafer 5, in the present embodiment, as described in FIGS. 2 and 3, the contact holes 24/24 and the contact hole 26 are formed. By depositing a metal electrode material thereon, a contact and a metal film are formed. In addition, the source electrode 22 and the drain electrode 23 are formed by etching etc. in a common Si transistor formation process. Furthermore, a TEOS film having a thickness of 2 μm is formed. The surface of the TEOS film is shaved off 1 μm so as to form a TEOS film as the planarized oxide film 10b (second planarized oxide film).

As for a polish of the TEOS film by the CMP method, it is preferable that a TEOS film be formed in a large thickness and then polished down the thickness largely because this provides a better flatness Rms of the surface of a substrate and reduces waviness of the surface of the substrate. However, in this case, a time for polishing becomes long. Therefore, it is preferable to select an appropriate thickness of the TEOS film in order to avoid polishing of too long time. Specifically, a thickness of the TEOS film is preferably in a range of 1.0 μm to 3 μm.

The following describes a method for manufacturing the semiconductor device 100 with reference to (a) to (m) of FIG. 1, FIG. 2, and FIG. 5. For the sake of simplicity of the description, a substrate on which the transistor 70 (the monocrystalline Si thin film transistor 70a) is formed is generically referred to as "transistor substrate," regardless of whether or not the transistor 70, which is the monocrystalline Si thin film transistor 70a here, is built right onto the monocrystalline Si wafer 5 or is held by the monocrystalline Si wafer 5 after transfer.

As illustrated in (a) of FIG. 1, the device substrate 20 is formed through the steps described above, which are illustrated in (a) to (f) of FIG. 4 whereas the first temporary supporting substrate 30 is prepared as illustrated in (b) of FIG. 1.

The first temporary supporting substrate 30 is a substrate for improving characteristics of the transistor 70 (the monocrystalline Si thin film transistor 70a) in such a manner that, the transistor 70 (which is the monocrystalline Si thin film transistor 70a here) built right onto the device substrate 20, which is a transistor substrate, is temporarily transferred to the first temporary supporting substrate 30 and the first temporary supporting substrate 30 is heat-treated, thereby repairing a crystal defect in a transistor channel on the device substrate 20 (i.e., a crystal defect in a transistor channel of the transistor 70). Hereafter, such a substrate is referred to as "temporary supporting substrate (C)."

In the present embodiment, "repairing a crystal defect" means to reduce crystal defects in a transistor channel of the transistor 70 (semiconductor element). Although a decrease in crystal defects in a transistor channel can be found by observation, the decrease can be also found from raised mobility of an obtained semiconductor transistor, a decreased leak current, a decrease in an S (Subthreshold) value, or the like. In the present embodiment, a crystal defect is most preferably repaired to the extent that transistor characteristics which are obtained from a nondefective monocrystalline Si can be obtained. In the present invention, "a temperature for repairing a crystal defect" means a temperature at which crystal defects in the transistor channel can be reduced.

Therefore, used as the first temporary supporting substrate 30 is a substrate which does not suffer from a plastic deformation in a heat treatment for repairing the crystal defects. Specifically, for example, a substrate having a heat resistance of 700° C. or more, for example, in a range of 700° C. to 1400° C. It is more preferable that the heat resistance of the first temporary supporting substrate 30 is higher. However, since an upper temperature limit of a heat treatment is a temperature at which an impurity doping profile does not change, there is a limit in actuality. Therefore, there is no specific temperature for an upper temperature limit of a heat treatment, as long as the first temporary supporting substrate 30 does not suffer from a plastic deformation at a heat treatment temperature for repairing the crystal defect.

The first temporary supporting substrate 30 can be specifically a monocrystalline Si substrate, for example, but is not limited to a specific substrate as long as the conditions above are satisfied. Among such substrates, an Si substrate such as a monocrystalline Si substrate is suitable for the first temporary supporting substrate 30 because the Si substrate has a high heat resistance and is easily available.

When using an Si substrate such as a monocrystalline Si substrate as the first temporary supporting substrate 30, it is preferable in a viewpoint of adhesion energy that, by performing a thermal oxidation on the surface of the Si substrate after a cleaning of the surface, a thermally-oxidized film is formed on the surface.

The thermally-oxidized film has a high adhesion energy. Therefore, by forming the thermally-oxidized film, adherability can be improved. Accordingly, a thickness of the thermally-oxidized film is not especially limited, but is preferable in a range of 30 nm to 300 nm from a view point of a time for film formation.

A method for the cleaning is not especially limited, but a normal method can be employed. For example, a cleaning method with SC1 and the like are employed.

The thermally-oxidized film can be easily formed by heat-treating the surface of the Si substrate at a temperature in a range of 1000 to 1200° C.

As described, the first temporary supporting substrate 30 is a substrate onto which the monocrystalline Si thin film transistor 70a built on the device substrate 20 is temporarily transferred. Therefore, the first temporary supporting substrate 30 is stripped after characteristic improvement of the monocrystalline Si thin film transistor 70a. Therefore, a surface size of the first temporary supporting substrate 30 and a thickness thereof are not especially limited as long as the first temporary supporting substrate 30 can support the monocrystalline Si thin film transistor 70a built on the device substrate 20.

Accordingly, the first temporary supporting substrate 30 should have at least the same size of the monocrystalline Si thin film transistor 70a built on the device substrate 20. Alternatively, the first temporary supporting substrate 30 may have the same size of the device substrate 20 or may have a larger size than the device substrate 20.

In the present embodiment, a substrate as the first temporary supporting substrate 30 is prepared in such a way that, after cleaning the surface of a monocrystalline Si wafer 31 (monocrystalline Si substrate), which has the same size as the device substrate 20 (i.e., the monocrystalline Si wafer 5 on which the monocrystalline Si thin film transistor 70a is formed), the monocrystalline Si wafer 31 is thermally oxidized in an oxidation furnace at 1100° C. for 60 minutes, thereby forming on the surface of the monocrystalline Si wafer 31 (on a surface onto which a transistor is transferred) a thermally-oxidized film 32 having a thickness of 200 nm.

In order to clean each bonding surface of the first temporary supporting substrate 30 and the device substrate 20 by removing organic matters therefrom, each bonding surface is cleaned with an SC1 solution so as to be activated and is washed with water.

Then, as illustrated in (c) of FIG. 1, after drying both substrates with a spin dryer etc. so as to dry each surface thereof, both substrates are bonded to each other while both substrates being appressed against each other at a room temperature.

After cleaning/drying, the first temporary supporting substrate 30 and the device substrate 20 spontaneously bond to each other by bring both substrates into contact with each other and pressing both substrates with a small force. That is, bonding of both substrates is realized without an adhesive, due to a contribution of Van der Waals' force, a contribution of an electric dipole, and a contribution of hydrogen bonding. The bonding is easily realized between substrates such that each bonding surface thereof has a close proportion of the three contributions above to each other. Therefore, cleanness of the surfaces of the substrates and a degree of activity are very important for bonding both substrates without an adhesive. In order to bond both substrates without an adhesive, before bonding, both substrates are preferably dried after being cleaned with an SC1 solution.

Thus, the monocrystalline Si thin film transistor 70a is bonded onto the first temporary supporting substrate 30, with an inorganic insulating film sandwiched inbetween.

When a temperature in the ion doping layer 15 of the device substrate 20 is raised to a temperature at which hydrogen dissipates from the device substrate 20 or higher (specifically, a temperature in a range of 400 to 600° C. or higher), the monocrystalline Si wafer 5 is cleaved and separated, so that a cleaved surface may be the ion doping part 15 (a projection range of hydrogen ion doping).

In the present embodiment, after bonding, both substrates are heat-treated by RTA (Rapid Thermal Annealing) for 10 minutes. As a result, as illustrated in (d) of FIG. 1, an unnecessary part 5a of the monocrystalline Si wafer 5 of the device substrate 20 is cleaved and stripped along the ion doping layer 15 by the so-called Smart-Cut® method. Thus, a transferring layer including the monocrystalline Si thin film transistor 70a is separated from the device substrate 20 (first transferring step). The RTA process is preferably performed at a temperature at which hydrogen surely dissipates from the device substrate 20 or more, specifically at a temperature in a range of 600 to 700° C.

Due to the heat treatment, the following reaction occurs at the interface between the device substrate 20 and the first temporary supporting substrate 30, which has been bonded to each other by Van der Waals' force:

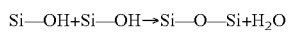

Si—OH+Si—OH→Si—O—Si+H$_2$O

As a result, both substrates are further tightly bonded to each other due to an atomic bond.

As illustrated in (e) of FIG. 1, the stripped surface of the monocrystalline Si wafer 5 on the side of a transistor substrate 40 (i.e., the surface of a thermally-oxidized film 5b), the transistor substrate 40 obtained through the step above, is etched so that the monocrystalline Si wafer 5 remained on the surface of the monocrystalline Si thin film transistor 70a may have a desired thickness.

The transistor substrate 40 is heat-treated at a high heat, thereby repairing a crystal defect in the transistor channel in order to improve characteristics of the monocrystalline Si thin film transistor 70*a*.

A crystal defect in the transistor channel can be repaired by heat-treating the transistor substrate 40 at a temperature in a range of 700° C. to an upper temperature limit of the first temporary supporting substrate 30. Specifically, the temperature is in a range of 700 to 1400° C., more preferably in a range of 700 to 1200° C., or especially more preferably in a range of 700 to 900° C.

A temperature for the heat treatment depends on varieties of the base substrate of the device substrate 20. The heat treatment is basically set to such a temperature range and process condition that impurity doping profiles of the source/drain/channel of does not change. This is because, if the impurity doping profiles of the source/drain/channel change, this may result in a change in the characteristics of the transistor 70 (which is the monocrystalline Si thin film transistor 70*a* here).

As the heat treatment reduces the crystal defects, a time for the heat treatment is not especially limited, but can be set according to a temperature for the heat treatment. However, also the time for the heat treatment is preferably set to a time in a range such that the impurity doping profiles do not change. Therefore, the temperature for the heat treatment is preferably shorter as long as the same characteristics can be obtained. The higher the temperature for the heat treatment, the shorter the time for the heat treatment to obtain the same effect. Accordingly, the time for the heat treatment depends on the temperature for the heat treatment, but is set in a range of, for example, one minute to two hours, approximately. However, the time for the heat treatment can be changed according to the temperature for the heat treatment.

In the present embodiment, the transistor substrate 40 is heat-treated, specifically, at 850° C. for one hour, in order to improve characteristics of a transistor (crystal defect repairing step).

In order to re-transfer the monocrystalline Si thin film transistor 70*a*, as illustrated in (f) of FIG. 1, a TEOS film 41 having a thickness of 2 μm is formed on the monocrystalline Si thin film transistor 70*a* of the transistor substrate 40 and the surface of the TEOS film 41 is etched to a depth of 1.2 μm by CMP method so as to planarize the surface.

On the other hand, as illustrated in (g) of FIG. 1, a second temporary supporting substrate 50 is prepared.

The second temporary supporting substrate 50 is a substrate onto which the monocrystalline Si thin film transistor 70*a* is temporarily transferred (hereafter, referred to as "temporary supporting substrate (D)"), in order to strip the first temporary supporting substrate 30 from the transistor substrate 40, whose transistor has been improved in its characteristics, before transferring the monocrystalline Si thin film transistor 70*a* onto the TFT substrate 80, which is a production substrate.

That is, since the first temporary supporting substrate 30 is also unnecessary for the complete semiconductor device 100 as well as the base substrate of the device substrate 20, it is necessary to remove the first temporary supporting substrate 30.

However, as described, the first temporary supporting substrate 30 is tightly bonded, by the heat treatment at a high heat in the crystal defect repairing step, onto the transistor substrate 40, namely, the device substrate 20 such that the monocrystalline Si wafer 5 has been removed by cleaving along the ion doping layer 15.

This automatically limits a method for cleaving and removing the first temporary supporting substrate 30, which is tightly bonded onto the transistor substrate 40.

However, in a case where the first temporary supporting substrate 30 is transferred onto the TFT substrate 80 which is a production substrate and removed by cleavage caused by ion doping, namely, by the so-called Smart-Cut® method, crystal defects are generated in the transistor channel of the TFT substrate 80. As a result, transistor characteristics are degraded. Therefore, it is meaningless to transfer the device substrate 20 onto the first temporary supporting substrate 30 instead of the TFT substrate 80.

Furthermore, when the monocrystalline Si thin film transistor 70*a* is transferred onto the second temporary supporting substrate 50, the same thing happens again by removing the first temporary supporting substrate 30 by the so-called Smart-Cut® method so as to cleave and remove the second temporary supporting substrate 50 from the monocrystalline Si thin film transistor 70*a*.

As for methods for cleaving and removing the first temporary supporting substrate 30 from the transistor substrate except the Smart-Cut® method, there would be, for example, (a) a method such that the first temporary supporting substrate 30 and the device substrate 20 are bonded to each other in advance with an adhesive when transferring to the first temporary supporting substrate 30 the monocrystalline Si thin film transistor 70*a* built onto the device substrate 20 and (b) a method such that the first temporary supporting substrate 30 is removed by etching.

When the former method is used, without temporary transferring the first temporary supporting substrate 30 onto the second temporary supporting substrate 50 in order to cleave and remove the first temporary supporting substrate 30 from the transistor substrate 40, the monocrystalline Si thin film transistor 70*a*, which has been transferred onto the first temporary supporting substrate 30, can be transferred onto the TFT substrate 80 by stripping the first temporary supporting substrate 30 from an adhesive layer after directly bonding the first temporary supporting substrate 30 onto the TFT substrate 80, which is a production substrate.

However, in fact, the former method is difficult to employ because there is no conventionally known adhesive which has a high heat resistance to the extent to which the heat treatment at a high heat for repairing the crystal defects can be performed, moderate fragility, and the like, so that easy stripping and temporary bonding can be performed.

According to the latter method, when directly bonding the first temporary supporting substrate 30 to a production substrate, in a case where the production substrate is the TFT substrate 80 on which the wiring layer 82 (wiring pattern) has been formed in advance, the wiring layer 82 formed on the TFT substrate 80 can be damaged depending on an etching method and a material for a wiring. For example, when an aluminum wiring is formed on the TFT substrate 80, etching cannot be performed with an alkali.

In such a case, a wiring pattern is formed after transferring the monocrystalline Si thin film transistor onto the insulating substrate 81 on which the wiring layer 82 has not been formed yet. According to this method, without temporarily transferring the first temporary supporting substrate 30 onto the second temporary supporting substrate 50 in order to cleave and remove the first temporary supporting substrate 30 from the transistor substrate 40, the monocrystalline Si thin film transistor 70*a*, which is transferred onto the first temporary supporting substrate 30, can be directly transferred onto the insulating substrate 81.

According to the present invention, the semiconductor device 100 may be manufactured in such a manner that, after the transistor 70 (monocrystalline Si thin film transistor 70a) built on the monocrystalline Si wafer 5 is temporarily transferred at least once onto a temporary supporting substrate (first temporary supporting substrate 30) other than the production substrate so as to repair crystal defects, the transistor 70 is made into a chip and is transferred onto the insulating substrate 81, which is a production substrate to mount the transistor 70 thereon, thereafter forming the wiring layer 82 which has a wiring pattern.

However, an oxide film formed on the insulating substrate 81 by, for example, CVD (chemical vapor deposition) normally has some defects. As a result, when the first temporary supporting substrate 30 and the production substrate are exposed to an etchant for a long time in order to strip the first temporary supporting substrate 30 from the production substrate, even if a wiring pattern is formed after transferring the monocrystalline Si thin film transistor 70a onto the insulating substrate 81 on which the wiring pattern has not been formed, a roughness is made on the surface of the insulating substrate 81 depending on absence or presence and degree of the defects. This roughness decreases a yield.

In a case where the device substrate 20 is directly mounted on the insulating substrate 81, the same problem arises when removing by etching an unnecessary base substrate of the device substrate 20 from the insulating substrate 81.

Therefore, in order to strip the first temporary supporting substrate 30 from the transistor substrate 40, it is more preferable that, as described, the first temporary supporting substrate 30 is bonded onto the another temporary supporting substrate, namely, the second temporary supporting substrate 50 so as to transfer the monocrystalline Si thin film transistor 70a onto the second temporary supporting substrate 50 and the first temporary supporting substrate 30 is stripped from the second temporary supporting substrate 50, on which the monocrystalline Si thin film transistor 70a is transferred, without directly bonding the first temporary supporting substrate 30 on which the monocrystalline Si thin film transistor 70a has been transferred to the insulating substrate 81 which is a production substrate.

As described, the second temporary supporting substrate 50 is a substrate onto which the monocrystalline Si thin film transistor 70a is temporarily transferred in order to strip the first temporary supporting substrate 30.

Therefore, with respect to the second temporary supporting substrate 50, a material thereof, in other words, a type thereof is not especially limited as long as the type is not the same as that of the production substrate which is finally used and on which the wiring layer 82 is or has been formed.

For example, the same type of substrate as the first temporary supporting substrate 30 can be used as the second temporary supporting substrate 50. That is, an example of a substrate used for the second temporary supporting substrate 50 is a substrate having a heat resistance in a range of 700° C. to 1400° C., or preferably, in a range of 800° C. to 1400° C.

Specifically, examples of the second temporary supporting substrate 50 encompass a monocrystalline Si substrate etc. Among such substrates, an Si substrate such as a monocrystalline Si substrate is suitably used for the second temporary supporting substrate 50 because the Si substrate is easily available.

The second temporary supporting substrate 50 also merely holds the monocrystalline Si thin film transistor 70a temporarily, as well as the first temporary supporting substrate 30. Therefore, the second temporary supporting substrate 50 is eventually stripped and removed.

Accordingly, it is preferable that the second temporary supporting substrate 50 can be easily stripped and removed from the monocrystalline Si thin film transistor 70a after transferring the monocrystalline Si thin film transistor 70a onto the other substrate, for example, onto the TFT substrate 80 as a production substrate.

That is, the same thing is meaninglessly repeated by employing the so-called Smart-Cut® method in order to strip the second temporary supporting substrate 50 from the monocrystalline Si thin film transistor 70a after transferring the monocrystalline Si thin film transistor 70a onto the second temporary supporting substrate 50, as well as stripping and removing the first temporary supporting substrate 30 from the monocrystalline Si thin film transistor 70a.

Therefore, it is preferable that a material of the second temporary supporting substrate 50 is split by a weakened cohesion thereof caused by a compositional change of the material which compositional change is induced by heat, laser irradiation, or the like. Alternatively, on the surface of the second temporary supporting substrate 50, it is preferable to provide as a layer to be cleaved a layer which is split by a weakened cohesion thereof caused by a compositional change induced by heat, laser irradiation, or the like. Alternatively, it is preferable to provide as a layer to be cleaved an adhesive layer on the surface of the second temporary supporting substrate 50. Obviously, when bonding the second temporary supporting substrate 50 onto the transistor substrate with an adhesive, it is not always necessary to form the adhesive layer in advance on the surface of the second temporary supporting substrate 50. Alternatively, the adhesive layer may be deposited onto the transistor substrate 40.

The second temporary supporting substrate 50 does not require the heat treatment for repairing crystal defects at a high heat. Therefore, the second temporary supporting substrate 50 does not require as high heat resistance as the first temporary supporting substrate 30 has. Similarly, an adhesive for bonding the second temporary supporting substrate 50 with the transistor substrate 40 does not require as high heat resistance as an adhesive for bonding the first temporary supporting substrate 30 with the device substrate 20 which is a transistor substrate.

Accordingly, a conventionally known adhesive can be used as the adhesive for bonding the second temporary supporting substrate 50 with the transistor substrate.

A material for the layer to be cleaved which is formed on the surface of the second temporary supporting substrate 50 or a material for the second temporary supporting substrate 50 which material is cleavable is not especially limited to a specific material as long as the material is split by a weakened cohesion thereof caused by a compositional change induced by an extraneous factor. Such materials include hydrogenated amorphous silicon (a-SiH), in particular, a-SiH containing hydrogen in a range of 10 to 25% by weight, porous Si (porous silicon), and the like.

The second temporary supporting substrate 50 is also stripped as well as the first temporary supporting substrate 30 after transferring the monocrystalline Si thin film transistor 70a onto another substrate, namely, the TFT substrate 80 in the present embodiment. Therefore, a surface size and a thickness are not especially limited as long as the monocrystalline Si thin film transistor 70a can be supported. That is, as in the case of the first temporary supporting substrate 30, the second temporary supporting substrate 50 may be also in the same size as the monocrystalline Si thin film transistor 70a or in a size larger than the monocrystalline Si thin film transistor 70a.

In the present embodiment, a monocrystalline Si wafer 51 (monocrystalline Si substrate) having the same size as the first temporary supporting substrate 30 is used for a base substrate as the second temporary supporting substrate 50. An a-SiH (hydrogenated amorphous silicon) layer 52 containing hydrogen of 15% by weight and an $SiO_2$ layer 53 are laminated in this order on the surface of the monocrystalline Si wafer 51. A thickness of the a-SiH layer 52 is 500 nm. A thickness of the $SiO_2$ layer 53 is 2 μm. The a-SiH layer 52 and the $SiO_2$ layer 53 are continuously formed by PCVD. The surface of the $SiO_2$ layer 53 is planarized by etching to a depth of 1000 nm by CMP.

Then, the first temporary supporting substrate 30 on which the monocrystalline Si thin film transistor 70a is transferred, and the second temporary supporting substrate 50 are subjected to hydrophilic treatment in which a bonding surface of the first temporary supporting substrate 30 to the second temporary supporting substrate 50 and a bonding surface of the second temporary supporting substrate 50 to the first temporary supporting substrate 30 are activated by washing with, for example, an SC1 solution, and then washed with water so as to hydrophilize the bonding surfaces.

The surfaces of both the substrates are dried by a spin dryer etc. As illustrated in (h) of FIG. 1, the first temporary supporting substrate 30 (i.e., the transistor substrate 40) on which the monocrystalline Si thin film transistor 70a has been transferred is bonded onto the second temporary supporting substrate 50 while both substrates being appressed against each other at a room temperature, in such a manner that the monocrystalline Si thin film transistor 70a is sandwiched between the second temporary supporting substrate 50 and the first temporary supporting substrate 30.

The transistor substrate 40 after washing and drying (that is, the transistor substrate 40 having improved characteristics) and the second temporary supporting substrate 50 spontaneously bond to each other by contacting both the substrates with each other and pressing both the substrates with a small force.

Then the first temporary supporting substrate 30 is removed by backgrinding until a thickness thereof is reduced to 100 μm or less. As illustrated in (i) of FIG. 1, by wet-etching with TMAH (tetramethylammonium solution), a remaining part of the first temporary supporting substrate 30 is completely removed. The thermally-oxidized film 32 of the first temporary supporting substrate 30 functions as an etching stopper.

After forming an oxidized film on the monocrystalline Si thin film transistor 70a, the surface of the oxidized film is planarized by CMP, thereby obtaining a transistor substrate 60.

As illustrated in (j) of FIG. 1, the transistor substrate 60, namely, the monocrystalline Si thin film transistor 70a transferred onto the second temporary supporting substrate 50 is split in a required chip size by dicing the second temporary supporting substrate 50. Thus, obtained is a transistor substrate 60a thus made into a chip, which is a device chip (transistor chip) to be transferred.

As illustrated in (k) of FIG. 1, the TFT substrate 80 containing a pixel area is prepared as a production substrate on which the monocrystalline Si thin film transistor 70a transferred onto the second temporary supporting substrate 50 is transferred.

In the present embodiment, used as the TFT substrate 80 is a substrate having on a glass substrate on which a panel is provided the pixel area and an area other than an area in which the device chip (transistor substrate 60a) is transferred. As illustrated in (l) of FIG. 1, a size larger area is provided for a device transfer area in which the device chip is transferred, in consideration of a margin for transfer.

Then, in order to clean each bonding surface of the transistor substrate 60a (device chip) and the TFT substrate 80, each bonding surface is cleaned.

Specifically, the TFT substrate 80 and the transistor substrate 60a are cleaned with, for example, SC1 and washed in water, thereby undergoing hydrophilic treatment. Then, each surface (transfer surface) of both the substrates is dried with a spin dryer etc.

As illustrated in (l) of FIG. 1, alignment is performed between the transistor substrate 60a and the TFT substrate 80 in accordance with an alignment mark 61 provided on the transistor substrate 60a. The transistor substrate 60a is bonded onto the TFT substrate 80 at a predetermined position on the TFT substrate 80 while both substrates being appressed against each other at a room temperature.

The alignment when bonding the transistor substrate 60a and the TFT substrate 80 is performed in such a manner that, as illustrated in FIG. 5, the alignment mark 61 formed on the transistor substrate 60a and an alignment mark 83 of the TFT substrate 80 are detected by visible light penetrating the TFT substrate 80 which visible light is irradiated from the side of the TFT substrate 80. FIG. 5 illustrates an example such that the alignment mark 61 on the transistor substrate 60a which is on an alignment stage 102 is detected by epi-illumination with a CCD camera 101 for alignment, which CCD camera is set in a microscope. A detection result is finally converted into an electric signal for processing.

The alignment mark 61 is formed on, for example, the LOCOS film 8 which is a field oxide film, using the same material as the gate electrode 7.

According to the method, a substrate which can be used for the production substrate is a substrate made of an optically-transparent material such as a glass substrate which substrate is transparent for short-wavelength visible light and UV rays and whose surface does not diffuse light. Therefore, as the alignment marks 83 and 61 can be detected through the production substrate, that is, the glass substrate here. This makes it possible to perform more precise alignment.

After thus bonding the transistor substrate 60a in a predetermined position on the TFT substrate 80, heat treatment by RTA is performed thereon so as to cause heat expansion (ablation) of hydrogen in the a-SiH layer 52 of the transistor substrate 60a which has been transferred onto the TFT substrate 80, thereby cleaving and removing an unnecessary part of the second temporary supporting substrate 50 from the a-SiH layer 52 as illustrated in (m) of FIG. 1 (final transfer step).

In the present embodiment, treatment conditions for the RTA process are not limited to the concrete conditions described above as long as cleavage by ablation can be caused. However, a temperature for the RTA process is preferably in a range of 600 to 800° C. for the stability of an impurity profile. A time for the RTA process is set according to the temperature above and is not especially limited. However, performing a too long RTA process is not preferable for the stability of the impurity profile. Therefore, a time for the RTA process is set to, for example, approximately 2 to 20 minutes.

The cleavage can be also caused by the irradiation of an excimer laser (XeCl etc.).

Then, as illustrated in (n) of FIG. 1, Si (a-SiH layer 52 and $SiO_2$ layer 53) in the transfer area on the TFT substrate 80 is thinned by, for example, dry etching etc. Furthermore, as illustrated in FIG. 2, the protective insulating film 91 is formed as an interlayer film.

As illustrated in FIG. 2, contact holes 25 are formed through the protective insulating film 91, the LOCOS film 8, and the NSG film 9. Then, the metal wiring layers 92 is formed in the contact holes 25. Each of the metal wiring layers 92 is connected to the source electrode 22, the drain electrode 23, and the gate electrode 7. Each of the metal wiring layers 92 and the wiring layer 82 on the TFT substrate 80 are connected (wiring connection process). In this way, the semiconductor device 100 of the present embodiment can be obtained.

In a case where the semiconductor device 100 is used for a driving device of a display apparatus such as an active-matrix liquid crystal display apparatus, an organic insulating film is further formed in a step for manufacturing a panel.

As described above, a method for manufacturing a semiconductor device of the present embodiment relates to a method such that, in order to transfer the transistor 70 (monocrystalline Si thin film transistor 70a) formed on a semiconductor substrate (A) such as the monocrystalline Si wafer 5, more specifically, in order to transfer a transferring layer including the transistor 70 onto a substrate (B) (production substrate) on which the transistor 70 is finally transferred, hydrogen ions or noble gas ions are doped into the semiconductor substrate (A) so as to perform heat treatment thereon, thereby a part of the semiconductor substrate (A), that is, an unnecessary part except the transistor 70 being cleaved at the ion doping layer in order to remove the unnecessary part from the semiconductor substrate (A) on which the transistor 70 (monocrystalline Si thin film transistor 70a) is formed.

That is, a method for transferring a semiconductor element of the present embodiment, in which method (I) from a semiconductor substrate (A) on which the semiconductor element is formed, a transferring layer including the semiconductor element is separated by doping hydrogen ions or noble gas ions in the semiconductor substrate (A), and then heat-treating the semiconductor substrate (A), so as to make a chip of the semiconductor element, and (II) the chip of the semiconductor element is transferred onto a substrate (B) on which the semiconductor element is finally mounted, the method includes: the ion doping step of doping hydrogen ions or noble gas ions in an interface of transferring layer of the semiconductor substrate (A) on which the semiconductor element is formed; the first transfer step of transferring the semiconductor element onto a temporary supporting substrate (C) in such a manner that the semiconductor substrate (A) on which the semiconductor element is formed is bonded onto the temporary supporting substrate (C) with the semiconductor element sandwiched therebetween and the semiconductor substrate (A) and temporary supporting substrate (C) thus bonded are heat-treated so as to separate the transferring layer to the temporary supporting substrate (C) from the semiconductor substrate (A), the temporary supporting substrate (C) having an upper temperature limit equal to or higher than a temperature for repairing crystal defects generated in a transistor channel of the semiconductor element due to the separation; the crystal defect repairing step of repairing the crystal defects by heat-treating the temporary supporting substrate (C) on which the semiconductor element is transferred, at a temperature equal to or higher than a temperature for repairing crystal defects which are generated in the transistor channel of the semiconductor element; and the final transfer step of making the semiconductor element into the chip and transferring the chip of the semiconductor element onto the substrate (B) by a different method from the first transfer step.

The method for transferring the semiconductor element of the present embodiment is preferably as below. Hydrogen ions or noble gas ions are doped into a semiconductor substrate (A) so as to perform heat treatment thereon. A part (unnecessary part) of the semiconductor substrate (A) is stripped at the layer in which ions are doped from the semiconductor substrate (A) on which a semiconductor element is formed. The semiconductor element is finally transferred onto a substrate (B) whose upper temperature limit is lower than a temperature for repairing crystal defects, the crystal defects generated in a transistor channel of the semiconductor element by thus stripping. Specifically, before transferring the semiconductor element onto the substrate (B), hydrogen ions or noble gas ions are doped into the semiconductor substrate (A) on which the semiconductor element has been formed and the semiconductor substrate (A) is bonded onto a temporary supporting substrate (C), with the semiconductor element sandwiched therebetween. The temporary supporting substrate C has heat resistance equal to or higher than a temperature for repairing crystal defects, the crystal defects generated in a transistor channel of the semiconductor element by thus stripping. By heat treating, a part (unnecessary part) of the semiconductor substrate (A) is stripped from the layer in which ions are doped. The semiconductor element is transferred onto the temporary supporting substrate (C). The temporary supporting substrate (C) is heat treated at a temperature equal to or higher than a temperature for repairing crystal defects, the crystal defects generated in the transistor channel of the semiconductor element so as to repair the crystal defects. The semiconductor element is then made into a chip and transferred onto the substrate (B) by a different method from the method for transferring the semiconductor element utilizing ion doping.

More specifically, a method for transferring the semiconductor element of the present embodiment is preferably as below. Hydrogen ions or noble gas ions are doped into a semiconductor substrate (A) so as to perform heat treatment thereon. A part (unnecessary part) of the semiconductor substrate (A) is stripped at the layer in which ions are doped from the semiconductor substrate (A) on which a semiconductor element has been formed. The semiconductor element is finally transferred onto a substrate (B) whose upper temperature limit is lower than 700° C. Specifically, before transferring the semiconductor element onto the substrate (B), hydrogen ions or noble gas ions are doped into the semiconductor substrate (A) on which the semiconductor element has been formed and the semiconductor substrate (A) is bonded onto a temporary supporting substrate (C), with the semiconductor element sandwiched therebetween. The temporary supporting substrate C has an upper temperature limit equal to or higher than 700° C. By heat treating, a part (unnecessary part) of the semiconductor substrate (A) is stripped from the layer in which ions are doped. The semiconductor element is transferred onto the temporary supporting substrate (C). The temporary supporting substrate (C) is heat treated at a temperature in a range of 700° C. to the upper temperature limit of the temporary supporting substrate (C) so as to repair crystal defects generated in the transistor channel of the semiconductor element. The semiconductor element is then made into a chip and transferred onto the substrate (B) by a different method from the method for transferring the semiconductor element utilizing ion doping.

According to the method for manufacturing the semiconductor device, before transferring a device substrate, specifically, the transistor 70 (monocrystalline Si thin film transistor 70a) built onto the semiconductor substrate (A) such as the monocrystalline Si wafer 5 onto the substrate (B) (production substrate) on which the transistor 70 is finally transferred, the transistor 70 is transferred onto a temporary supporting substrate at least once or preferably at least twice (i.e., at least onto the temporary supporting substrate (C) having high heat resistance, namely, the first temporary supporting substrate) so as to cleave and strip an unnecessary part 5a (a part except the transistor 70) of the semiconductor element (A). Then, the temporary supporting substrate (C) on which the transistor 70 has been transferred is heated at a temperature equal to or higher than a temperature for repairing crystal defects (i.e., 700 to 1200° C.) so as to repair crystal defects in the transistor channel after stripping the semiconductor substrate (A). The transistor 70 is made into a chip and transferred onto the substrate (B) by a different method (i.e., a method except the Smart-Cut® method) from the method for stripping the unnecessary part 5a of the semiconductor substrate (A).

Different methods from the method for stripping the unnecessary part 5a of the semiconductor substrate (A) include (I) a method utilizing etching, (II) a method utilizing an adhesive, (III) a method utilizing a layer (a) whose cohesion decreases due to compositional change induced by external factors such as heat and laser irradiation, the layer such as an a-SiH layer and a porous Si, (IV) combination of (I) to (III), and the like.

More specifically, for example, there are the following methods as described above.

(1) a method such that, after bonding onto the substrate (B) which is a production substrate the temporary supporting substrate (C) on which the transistor 70 has been transferred, which temporary supporting substrate (C) is the first temporary supporting substrate, with the transistor 70 sandwiched therebetween, the temporary supporting substrate (C) which is a source of transfer is removed by etching.

(2) a method such that, after bonding onto the substrate (D) which is the second temporary supporting substrate the temporary supporting substrate (C) on which the transistor 70 has been transferred, which temporary supporting substrate (C) is the first temporary supporting substrate, with the transistor 70 sandwiched therebetween, the transistor 70 is transferred onto the temporary supporting substrate (D) by removing the temporary supporting substrate (C) by etching and the temporary supporting substrate (D) is bonded onto the substrate (B) which is a production substrate, with the transistor 70 sandwiched therebetween, thereafter the temporary supporting substrate (D) being removed by etching.

(3) a method such that, after bonding with an adhesive onto the temporary supporting substrate (D) which is the second temporary supporting substrate the temporary supporting substrate (C) on which the transistor 70 has been transferred, which temporary supporting substrate (C) is the first temporary supporting substrate, with the transistor 70 sandwiched therebetween, the transistor 70 is transferred onto the temporary supporting substrate (D) by removing the temporary supporting substrate (C) by etching and the temporary supporting substrate (D) is bonded onto the substrate (B) which is a production substrate with the transistor 70 sandwiched therebetween, thereafter the temporary supporting substrate (D) being stripped from a layer of the adhesive.

(4) a method such that, after bonding the temporary supporting substrate (C) which is the first temporary supporting substrate onto the temporary supporting substrate (D) which is the second temporary supporting substrate having a layer (a) such as an a-SiH layer and a porous Si layer, the layer (a) whose cohesion decreases due to compositional change induced by external factors such as heat and laser irradiation, the transistor 70 is transferred onto the temporary supporting substrate (D) by removing the temporary supporting substrate (C) by etching and the temporary supporting substrate (D) is bonded onto the substrate (B) which is a production substrate, thereafter the temporary supporting substrate (D) being stripped from the layer (a) such as the a-SiH layer and the porous Si layer.

The transistor 70 is made into a chip before being transferred onto the substrate (B).

The number of times that the transistor 70 is transferred onto the temporary supporting substrate is not especially limited. That is, as described above, as long as the transistor 70 built onto the semiconductor substrate (A) is temporarily transferred onto the temporary supporting substrate (C) having high heat resistance so as to repair crystal defects, the transistor 70 may be directly transferred from the temporary supporting substrate (C) to the substrate (B). Alternatively, the transistor 70 may be transferred from the temporary supporting substrate (C) to the temporary supporting substrate (D) further and then transferred onto the substrate (B). Moreover, the transistor 70 may be transferred from the temporary supporting substrate (D) to another temporary supporting substrate (D) and then transferred onto the substrate (B). In a case where the transistor 70 from the temporary supporting substrate (D) onto another temporary supporting substrate (D), a direction of the transistor 70 (i.e., a building direction of the gate electrode 7 to the active layer 4) can be adjusted (changed) depending on the number of transfers.

According to the method above, as described, before transferring the transistor 70 formed on the semiconductor substrate (A) onto the substrate (B) which is a production substrate, the transistor 70 is transferred onto the temporary supporting substrate (C) having high heat resistance so as to cleave and strip the unnecessary part 5a of the semiconductor substrate (A). Then, the temporary supporting substrate (C) on which the transistor 70 has been transferred is heat treated at a temperature equal to or higher than a temperature for repairing crystal defects. As a result, a damaged layer having a crystal defect (lattice imperfection), the crystal defect made in the transistor channel after stripping an unnecessary part from the semiconductor substrate (A) is not merely removed, but the crystal defect itself (lattice imperfection) in the transistor channel can be repaired. This can fundamentally improve transistor characteristics affected by the crystal defect. Accordingly, the present invention can provide a semiconductor device having an S coefficient which is significantly lower than the conventional arts.

According to any methods above, an insulating substrate which has low heat resistance and has been conventionally difficult to use can be used as a production substrate. In addition, transistor characteristics can be improved. Furthermore, since only single doping of hydrogen ions or noble gas ions is required, a semiconductor device having a low S coefficient can be provided without an increase in manufacturing cost.

In a case where a substrate on which the transistor 70 is mounted is bonded onto the substrate (B) which is a production substrate, according to the method (3) or (4), especially the method (4), it is not required to perform etching of the substrate in order to remove an unnecessary part of the substrate. This allows a wide selection of wiring materials and makes it possible to improve a yield.

The transfer methods above can be selected according to a type of the substrate (B), a type of a semiconductor element to be transferred onto the substrate (B), for example, a type of the transistor 70, etc.

For example, in a case where a glass substrate such as a high-strain-point glass is used for the substrate (B) and a semiconductor element made of p-Si is provided in an area on the substrate (B) except an area in which the transfer device of the present invention is transferred (in other words, p-Si co-exists with the transfer device on the substrate (B)), the transfer method utilizing the layer (a) or the adhesive can be employed as a transfer method which is different from the method used for stripping the unnecessary part 5a of the semiconductor substrate (A).

In a case where a glass substrate such as a high-strain-point glass is used for the substrate (B) and a semiconductor element made of amorphous silicon (hereafter, referred to as "a-Si") is provided in an area on the substrate (B) except an area in which the transfer device of the present invention has been transferred (in other words, a-Si co-exists with the transfer device on the substrate (B)), it is more preferable to employ the transfer method utilizing the layer (a) or the adhesive as a transfer method for transferring the semiconductor element (A) onto the substrate (B) (i.e., a transfer method for the final transfer onto a production substrate) although etching utilizing an oxidized film can be used.

In a case where a substrate such as a plastic substrate, a thin film, and a metal film is used for the substrate (B), the transfer method utilizing the layer (a) or the adhesive is employed as a method for transferring the semiconductor element onto the substrate (B).

The transistor 70 which is mounted (transferred) according to the method of the present invention on the TFT substrate 80 has an S coefficient of 65 mV/decade or lower (i.e., S coefficient in a range of 60 (theoretical limitation) to 65 mV/decade). This is significantly low in contrast with a conventional S coefficient in a range of 90 to 100 mV/decade. This realizes excellent transistor characteristics which are considered to be impossibly difficult to realize utilizing a-Si or p-Si which is available currently or will be available a few years later.

Whether or not the semiconductor element of the present invention, for example, the transistor 70 is an element that was transferred onto the TFT substrate 80 by the method above can be determined by measuring crystallinity of Si of the transferred transistor 70.

For example, in a case where the transistor 70 was transferred onto a glass substrate by the method, an area in which the transistor 70 is transferred becomes monocrystalline by transferring crystal silicon onto the glass substrate whereas Si in an area in which the transistor 70 is not transferred is s-Si (strained silicon) or poly-Si. Therefore, it can be determined that the area in which the transistor 70 is transferred is monocrystalline because the area indicates a single direction such as (100) in, for example, Raman spectroscopic analysis or EBSP (Electron Back Scatter Diffraction Pattern). By thus determining crystal orientation, whether or not the method was used to transfer the transistor 70 onto the glass substrate can be determined.

The semiconductor device 100 of the present embodiment can be used in an area having a gate length of 0.25 μm, which is the half of a conventional gate length whereas a conventional semiconductor device can be used only in an area having a gate length of 0.5 μm and cannot be miniaturized further. This makes it possible to realize a device having a half area of a conventional device.

As described above, the semiconductor device 100 of the present embodiment may have on one substrate two types of transistors each having different characteristics from each other. By utilizing the advantage of each transistor, the semiconductor device 100 can be applied for various uses such as a display apparatus.

For example, the semiconductor device 100 may be arranged such that a transferred transistor which has been transferred on a TFT substrate and a formed transistor which has been formed on the TFT substrate coexist on an insulating substrate which is a production substrate, namely, on the TFT substrate.

The present embodiment described as an example a case where the transistor 70, namely, a transistor formed on the TFT substrate 80 by transfer is the monocrystalline Si thin film transistor 70a. However, the transistor 70 is not limited to the monocrystalline Si thin film transistor 70a, but may be a transistor of a different type.

Furthermore, the present embodiment described a transistor, in particular, a thin film transistor including an active layer and a gate electrode as an example of a semiconductor element which is to be mounted (transferred) onto the semiconductor device 100. However, the semiconductor device of the present invention is not limited to such a transistor, but may be, for example, a driver, a memory, a thin film diode, etc. for driving an active-matrix circuit.

The semiconductor device 100 is suitably applicable to, for example, a peripheral driving circuit and a control circuit of a TFT-driven active-matrix liquid crystal display apparatus or a display apparatus such as an intelligent liquid crystal display apparatus such that an MPU (Micro Processing Unit) and an image processing circuit are packaged on one substrate and an OLED (Organic Light Emitting Diode: organic EL) display apparatus.

In the present embodiment, the TEOS film was used for an oxide film which is required to be planarized, such as the planarized oxide film 10. However, the oxide films are not limited to this, but, as described above, an oxide film formed by the other film formation method such as an $SiO_2$ film formed by PCVD may be used instead of the TEOS film.

As the planarized oxide film such as the TEOS film is formed on the ion doping surface, namely, the ion doping layer 15, an ion doping area can have a flat shape.

The planarized oxide film such as the TEOS film is preferably formed on each bonding surface of substrates to be bonded to each other. This improves adherability of both substrates. Accordingly, both substrates can be bonded to each other, for example, without an adhesive. In a case where the bonding is realized by Van der Waals' force, each bonding surface is preferably flat, clean, and dry (i.e., containing no moisture). Water molecules in a several molecular layer do not cause a problem.

A flatness (Rms) of each bonding surface is preferably 0.5 nm or less, or, preferably 0.3 nm or less. A waviness size on each bonding surface is preferably 30 μm or less. The flatness (Rms) can be measured with an AFM (Atomic Force Microscope). The waviness size can be measured by surface roughness test with a contact stylus.

As described above, a method for manufacturing a semiconductor device includes a transferring step of transferring a semiconductor element onto a substrate (B) to be used in the semiconductor device by a transferring method for transferring the semiconductor device, in which transferring method (I) from a semiconductor substrate (A) on which the semiconductor element is formed, a transferring layer including the semiconductor element is separated by doping hydrogen ions or noble gas ions in the semiconductor substrate (A), and then heat-treating the semiconductor substrate (A), so as to make a chip of the semiconductor element, and (II) the chip of the semiconductor element is transferred onto a substrate (B) on which the semiconductor element is finally mounted, the transferring method including: the ion doping step of doping hydrogen ions or noble gas ions in an interface of transferring layer of the semiconductor substrate (A) on which the semiconductor element is formed; the first transfer step of transferring the semiconductor element onto a temporary supporting substrate (C) in such a manner that the semiconductor substrate (A) on which the semiconductor element is formed is bonded onto the temporary supporting substrate (C) with the semiconductor element sandwiched therebetween and the semiconductor substrate (A) and temporary supporting substrate (C) thus bonded are heat-treated so as to separate the transferring layer to the temporary supporting substrate (C) from the semiconductor substrate (A), the temporary supporting substrate (C) having an upper temperature limit equal to or higher than a temperature for repairing crystal defects generated in a transistor channel of the semiconductor element due to the separation; the crystal defect repairing step of repairing the crystal defects by heat-treating the temporary supporting substrate (C) on which the semiconductor element is transferred, at a temperature equal to or higher than a temperature for repairing crystal defects which are generated in the transistor channel of the semiconductor element; and the final transfer step of making the semiconductor element into the chip and transferring the chip of the semiconductor element onto the substrate (B) by a different method from the first transfer step.

As described above, the method for manufacturing the semiconductor device is method including the step for transferring the semiconductor element onto the substrate (B) which is used in the semiconductor device, by the method for transferring the semiconductor element.

As described above, the semiconductor device is fabricated by transferring by the method for transferring a semiconductor element, a chip of a semiconductor element onto the substrate (B) on which the semiconductor element is finally mounted, the semiconductor element being a semiconductor transistor and having an S coefficient of 65 mV/decade or less.

According to the method, the semiconductor element formed on the semiconductor substrate (A) is not directly transferred onto the substrate (B), but, before transferring the semiconductor element to the substrate (B), the semiconductor element is temporarily transferred onto the temporary supporting substrate (C), whose upper temperature limit is equal to or higher than a temperature for repairing a crystal defect, which is made in the transistor channel of the semiconductor element by the separation. As a result, the crystal defect, which is made in the transistor channel of the semiconductor element by the separation can be repaired through heat treatment at the temperature for repairing a crystal defect or higher. The method makes it possible to prevent characteristic degradation of the semiconductor element inevitably caused by a crystal defect, which crystal defect is inevitably made in a transistor channel of the semiconductor element by separating a transferring layer (by stripping the unnecessary part of the semiconductor substrate (A)) in order to transfer the semiconductor element from the semiconductor substrate (A) on which the semiconductor element has been formed.

According to the method, a damaged layer having a crystal defect (lattice imperfection), the crystal defect made in the transistor channel after stripping the unnecessary part of the semiconductor substrate (A) is not removed, but crystal defects themselves (lattice imperfection) in the transistor channel can be repaired. This can fundamentally improve transistor characteristics affected by the crystal defect.

Accordingly, employment of the method for transferring the semiconductor element for the manufacture of the semiconductor device realizes a semiconductor device having semiconductor characteristics improved than ever, especially, a semiconductor device having an S coefficient which is significantly lower than ever.

For a fuller understanding of the nature and advantages of the invention, reference should be made to the ensuing detailed description taken in conjunction with the accompanying drawings.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The semiconductor device according to the present invention has better device characteristics than the conventional arts. The semiconductor device is suitably applicable to, for example, a peripheral driving circuit and a control circuit of a TFT-driven active-matrix liquid crystal display apparatus or a display apparatus such as an intelligent liquid crystal display apparatus such that an MPU and an image processing circuit are packaged on one substrate and an OLED display apparatus.

The invention claimed is:

1. A method for transferring a semiconductor element, in which method (I) from a semiconductor substrate (A) on which the semiconductor element is formed, a transferring layer including the semiconductor element is separated by doping hydrogen ions or noble gas ions in the semiconductor substrate (A), and then heat-treating the semiconductor substrate (A), so as to make a chip of the semiconductor element, and (II) the chip of the semiconductor element is transferred onto a substrate (B) on which the semiconductor element is finally mounted, the method comprising:

the ion doping step of doping hydrogen ions or noble gas ions in an interface of transferring layer of the semiconductor substrate (A) on which the semiconductor element is formed;

the first transfer step of transferring the semiconductor element onto a temporary supporting substrate (C) in such a manner that the semiconductor substrate (A) on which the semiconductor element is formed is bonded onto the temporary supporting substrate (C) with the semiconductor element sandwiched therebetween and the semiconductor substrate (A) and temporary supporting substrate (C) thus bonded are heat-treated so as to separate the transferring layer to the temporary supporting substrate (C) from the semiconductor substrate (A), the temporary supporting substrate (C) having an upper temperature limit equal to or higher than a temperature for repairing crystal defects generated in a transistor channel of the semiconductor element due to the separation;

the crystal defect repairing step of repairing the crystal defects by heat-treating the temporary supporting substrate (C) on which the semiconductor element is transferred, at a temperature equal to or higher than a temperature for repairing crystal defects which are generated in the transistor channel of the semiconductor element; and the final transfer step of making the semiconductor element into the chip and transferring the chip of the semiconductor element onto the substrate (B) by a different method from the first transfer step.

2. The method as set forth in claim 1 comprising,
after the steps between the first transfer step and the final transfer step, a re-transfer step of transferring the semiconductor element at least once onto a temporary supporting substrate (D) in such a manner that the temporary supporting substrate (C) is bonded onto the temporary supporting substrate (D) having a layer (a) made of hydrogenated amorphous silicon or porous silicon, with the semiconductor element sandwiched therebetween, and then the temporary supporting substrate (C) is removed by etching, the final transfer step including:

making the chip with the semiconductor element and the temporary supporting substrate (D) on which the semiconductor element is transferred;

bonding the chip onto the substrate (B) in such a manner that the temporary supporting substrate (D) is bonded onto the substrate (B) with the semiconductor element sandwiched therebetween; and removing the temporary supporting substrate (D) by heat-treating the layer (a) or by laser irradiation thereto, so as to transfer the chip of the semiconductor element onto the substrate (B).

3. The method as set forth in claim 1 comprising, after the steps between the first transfer step and the final transfer step, a re-transfer step of transferring the semiconductor element at least once onto a temporary supporting substrate (D) in such a manner that the temporary supporting substrate (C) is bonded onto the temporary supporting substrate (D) having an adhesive layer, with the semiconductor element sandwiched therebetween, and the temporary supporting substrate (C) is removed by etching, the final transfer step including:

making the chip with the semiconductor element and the temporary supporting substrate (D) on which the semiconductor element is transferred;

bonding the chip with the substrate (B) in such a manner that the temporary supporting substrate (D) is bonded onto the substrate (B) with the semiconductor element sandwiched therebetween; and removing the temporary supporting substrate (D) at the adhesive layer, so as to transfer the chip of the semiconductor element onto the substrate (B).

4. The method as set forth in claim 1 comprising, after the steps between the first transfer step and the final transfer step, a re-transfer step of transferring the semiconductor element at least once onto a temporary supporting substrate (D) in such a manner that the temporary supporting substrate (C) is bonded onto the temporary supporting substrate (D) which is different from the temporary supporting substrate (C), with the semiconductor element sandwiched therebetween, and the temporary supporting substrate (C) is removed by etching, the final transfer step including:

making the chip with the semiconductor element and the temporary supporting substrate (D) on which the semiconductor element is transferred;

bonding the chip with the substrate (B) in such a manner that the temporary supporting substrate (D) is bonded onto the substrate (B) with the semiconductor element sandwiched therebetween; and removing the temporary supporting substrate (D) by etching, so as to transfer the chip of the semiconductor element onto the substrate (B).

5. The method as set forth in claim 1 wherein, the final transfer step includes:

making the chip with the semiconductor element and the temporary supporting substrate (C) on which the semiconductor element is transferred;

bonding the chip with the substrate (B) in such a manner that the temporary supporting substrate (C) is bonded onto the substrate (B) with the semiconductor element sandwiched therebetween; and removing the temporary supporting substrate (C) by etching, so as to transferring the chip of the semiconductor element onto the substrate (B).

6. The method as set forth in claim 1 comprising, before the first transfer step:

forming a silicon oxide film on the semiconductor element.

7. The method as set forth in claim 1 wherein the transferring layer and each substrate have a transfer surface having a flatness Rms of 0.5 nm or less and a waviness of 30 μm or less, the transfer surface of each substrate being a surface to which the transferring layer is to be bonded by the transferring.

8. The method as set forth in claim 1 wherein a temperature of the heat treatment in the crystal defect repairing step is in a range of 700° C. to 900° C.

9. The method as set forth in claim 1 wherein an upper temperature limit of the substrate (B) is lower than the temperature for repairing the crystal defects generated in the transistor channel of the semiconductor element.

10. The method for transferring a semiconductor element as set forth in claim 1 wherein the semiconductor element is a semiconductor transistor.

11. A method for manufacturing a semiconductor device comprising a transferring step of transferring a semiconductor element onto a substrate (B) to be used in the semiconductor device by a transferring method for transferring the semiconductor device, in which transferring method (I) from a semiconductor substrate (A) on which the semiconductor element is formed, a transferring layer including the semiconductor element is separated by doping hydrogen ions or noble gas ions in the semiconductor substrate (A), and then heat-treating the semiconductor substrate (A), so as to make a chip of the semiconductor element, and (II) the chip of the semiconductor element is transferred onto a substrate (B) on which the semiconductor element is finally mounted, the transferring method comprising:

the ion doping step of doping hydrogen ions or noble gas ions in an interface of transferring layer of the semiconductor substrate (A) on which the semiconductor element is formed;

the first transfer step of transferring the semiconductor element onto a temporary supporting substrate (C) in such a manner that the semiconductor substrate (A) on which the semiconductor element is formed is bonded onto the temporary supporting substrate (C) with the semiconductor element sandwiched therebetween and the semiconductor substrate (A) and temporary supporting substrate (C) thus bonded are heat-treated so as to separate the transferring layer to the temporary supporting substrate (C) from the semiconductor substrate (A), the temporary supporting substrate (C) having an upper temperature limit equal to or higher than a temperature for repairing crystal defects generated in a transistor channel of the semiconductor element due to the separation;

the crystal defect repairing step of repairing the crystal defects by heat-treating the temporary supporting substrate (C) on which the semiconductor element is transferred, at a temperature equal to or higher than a temperature for repairing crystal defects which are generated in the transistor channel of the semiconductor element; and the final transfer step of making the semiconductor element into the chip and transferring the chip of the semiconductor element onto the substrate (B) by a different method from the first transfer step.

* * * * *